(12) United States Patent
Kono et al.

(10) Patent No.: US 10,578,846 B2
(45) Date of Patent: *Mar. 3, 2020

(54) PROJECTION OPTICAL SYSTEM, EXPOSURE APPARATUS, AND ARTICLE MANUFACTURING METHOD

(71) Applicant: CANON KABUSHIKI KAISHA, Tokyo (JP)

(72) Inventors: Michio Kono, Utsunomiya (JP); Kiyoshi Fukami, Utsunomiya (JP); Ryosuke Fukuoka, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/051,937

(22) Filed: Aug. 1, 2018

(65) Prior Publication Data

US 2018/0341093 A1    Nov. 29, 2018

Related U.S. Application Data

(63) Continuation of application No. 15/728,631, filed on Oct. 10, 2017, now Pat. No. 10,067,325.

(30) Foreign Application Priority Data

Oct. 14, 2016 (JP) .................................. 2016-203033

(51) Int. Cl.
*G03F 7/20* (2006.01)
*G02B 17/08* (2006.01)

(52) U.S. Cl.
CPC ....... *G02B 17/084* (2013.01); *G02B 17/0852* (2013.01); *G03F 7/70225* (2013.01); *G03F 7/70316* (2013.01); *G02B 17/0844* (2013.01)

(58) Field of Classification Search
CPC ..... G03F 7/20; G03F 7/70316; G03F 7/70225
(Continued)

(56) References Cited

U.S. PATENT DOCUMENTS 4,097,125 A    6/1978 Suzuki
4,812,028 A    3/1989 Matsumoto
(Continued)

FOREIGN PATENT DOCUMENTS

CN    101995775 A    3/2011
CN    103109225 A    5/2013
(Continued)

OTHER PUBLICATIONS

Notice of Allowance issued in U.S. Appl. No. 15/728,631 dated May 10, 2018.
(Continued)

*Primary Examiner* — Hung Nguyen
(74) *Attorney, Agent, or Firm* — Rossi, Kimms & McDowell LLP

(57) ABSTRACT

The present invention provides a projection optical system including a first concave reflecting surface, a first convex reflecting surface, a second concave reflecting surface, and a third concave reflecting surface, wherein the first concave reflecting surface, the first convex reflecting surface, the second concave reflecting surface, and the third concave reflecting surface are arranged such that light from an object plane forms an image on an image plane by being reflected by the first concave reflecting surface, the first convex reflecting surface, the second concave reflecting surface, the first convex reflecting surface, and the third concave reflecting surface in an order named.

33 Claims, 15 Drawing Sheets

(58) Field of Classification Search
USPC .............................................. 355/53, 67–71
See application file for complete search history.

(56) References Cited

U.S. PATENT DOCUMENTS

| | | | |
|---|---|---|---|
| 5,078,502 A | 1/1992 | Cook | |
| 6,072,852 A | 6/2000 | Hudyma | |
| 9,229,205 B2 | 1/2016 | Ono | |
| 10,067,325 B2 * | 9/2018 | Kono | G02B 17/084 |
| 2007/0223119 A1 * | 9/2007 | Takahashi | G02B 17/0657 359/859 |
| 2008/0030822 A1 | 2/2008 | Anderton | |
| 2011/0116062 A1 | 5/2011 | Ono | |

FOREIGN PATENT DOCUMENTS

| | | |
|---|---|---|
| DE | 102010004827 A1 | 9/2010 |
| EP | 0452963 A2 | 10/1991 |
| JP | S525544 A | 1/1977 |
| JP | H05053057 A | 3/1993 |
| JP | H07057986 A | 3/1995 |
| JP | 2004029625 A | 1/2004 |
| JP | 2009276769 A | 11/2009 |
| JP | 2011039172 A | 2/2011 |
| TW | 200741325 A | 11/2007 |
| TW | I639063 B | 10/2018 |

OTHER PUBLICATIONS

Office Action issued in Taiwanese Appln. No. 107127048 dated Mar. 13, 2019. English translation provided.
Office Action issued in Japanese Appln. No. 2016-203033 dated Jul. 22, 2019.
Office Action issued in Taiwanese Application No. 107127048 dated Sep. 26, 2019. English translation provided.
Office Action issued in Chinese Appln. No. 201710934813.1 dated Dec. 30, 2019. English translation provided.

* cited by examiner

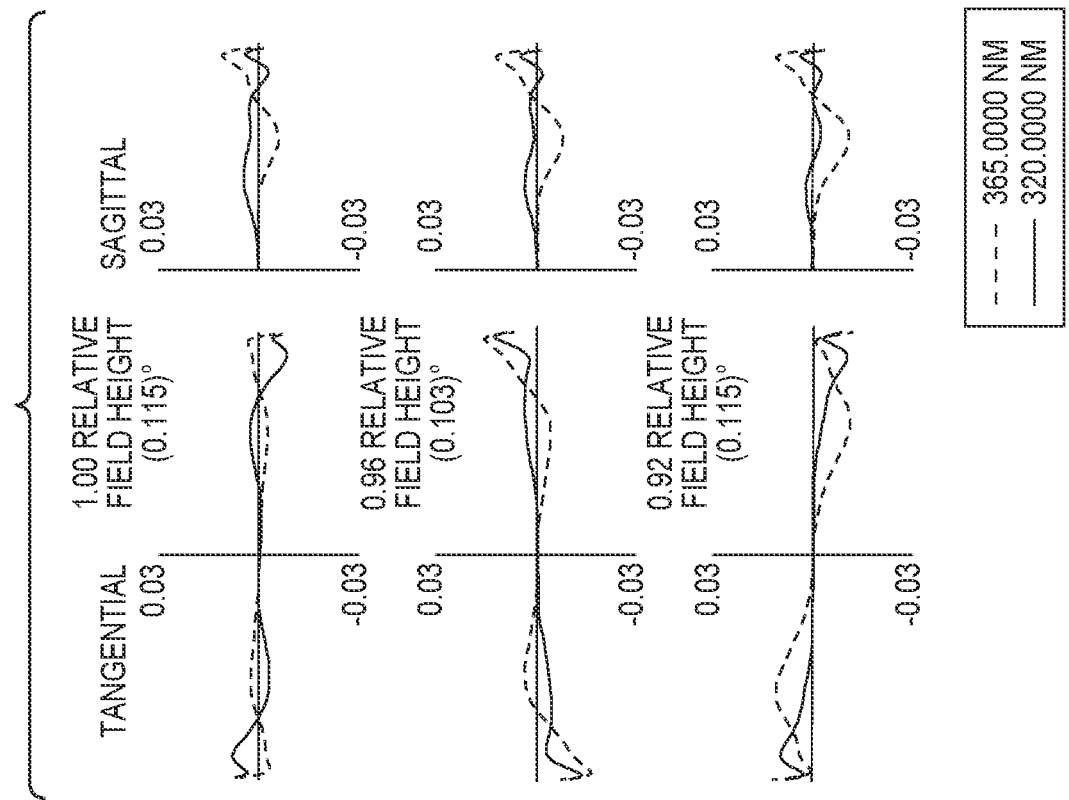
FIG. 2A
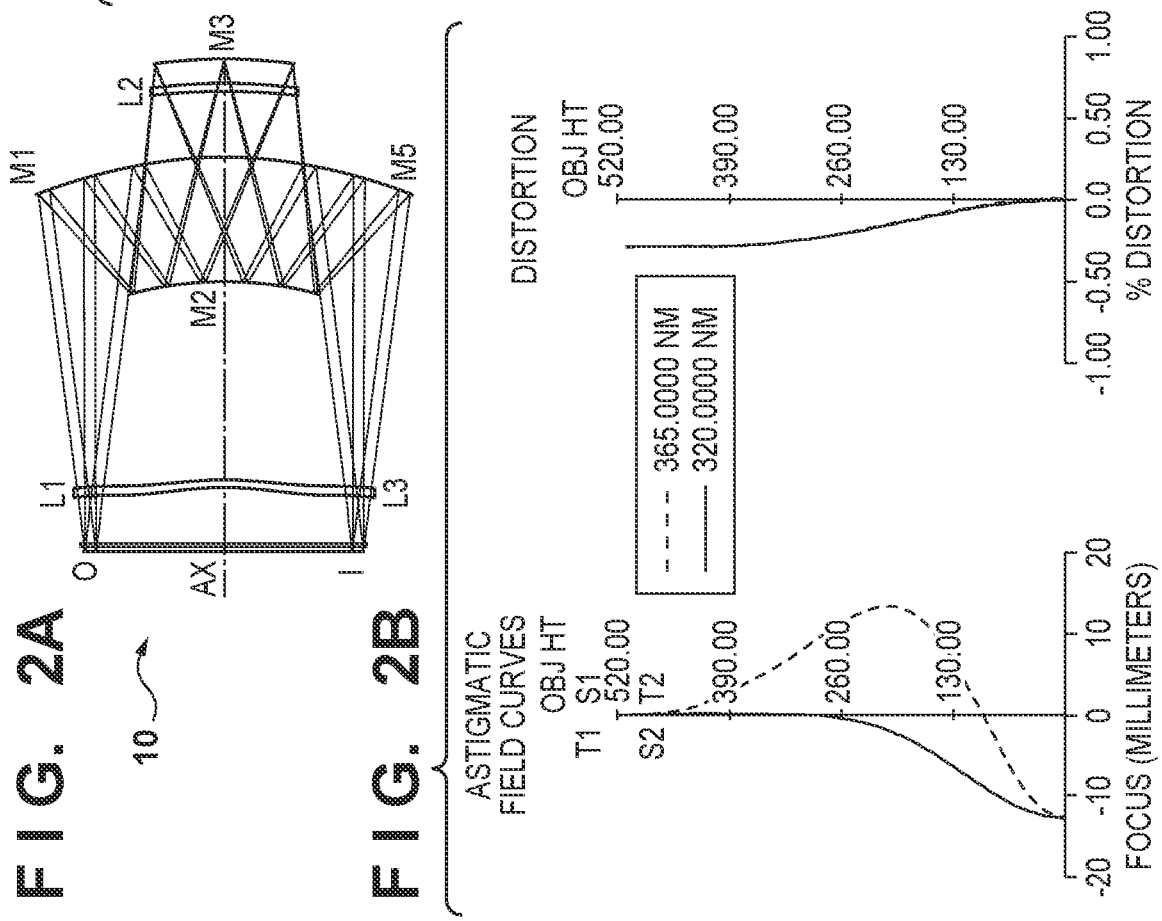
FIG. 2B
FIG. 2C

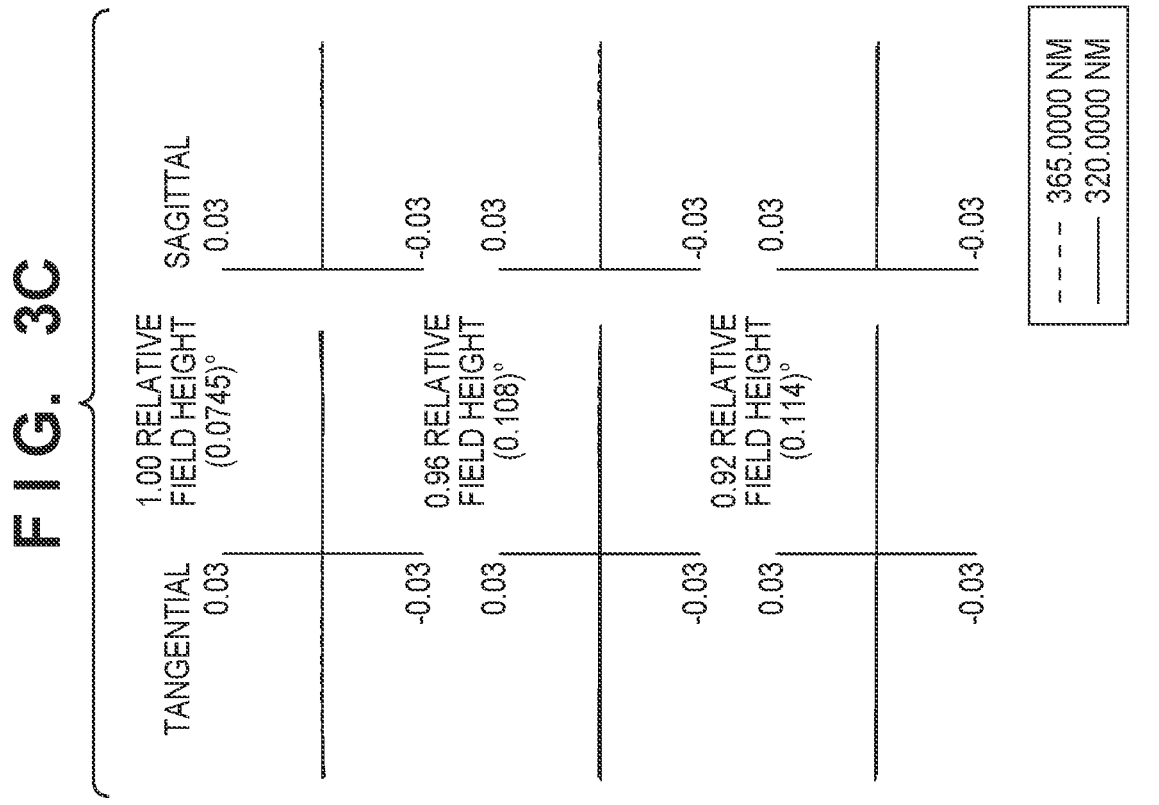
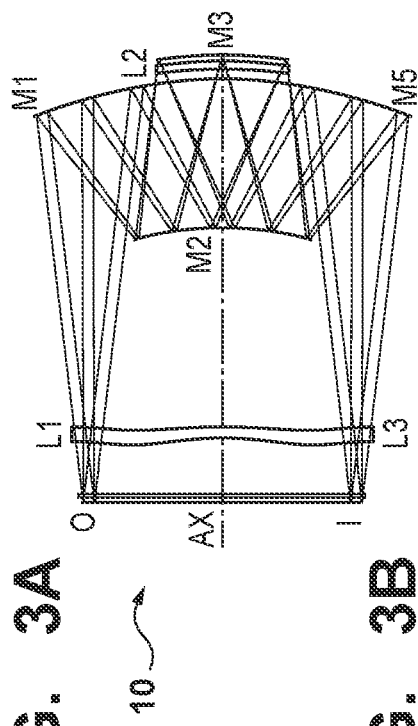
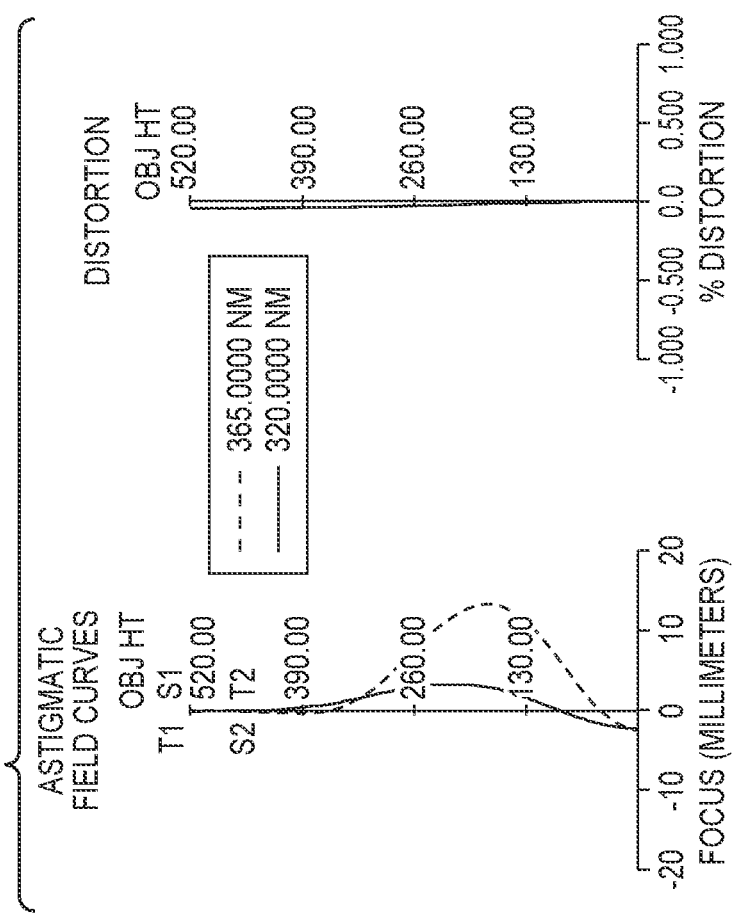

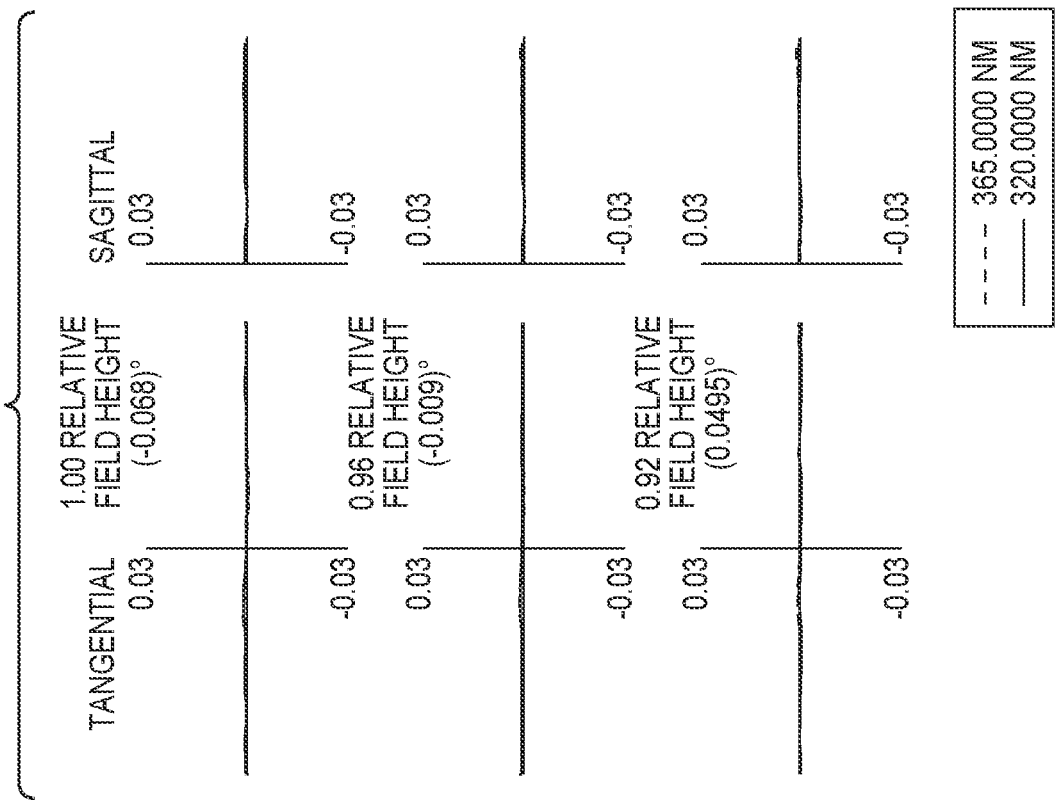
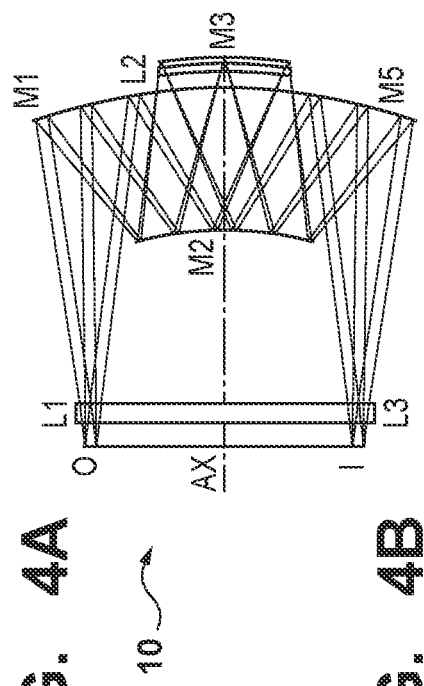
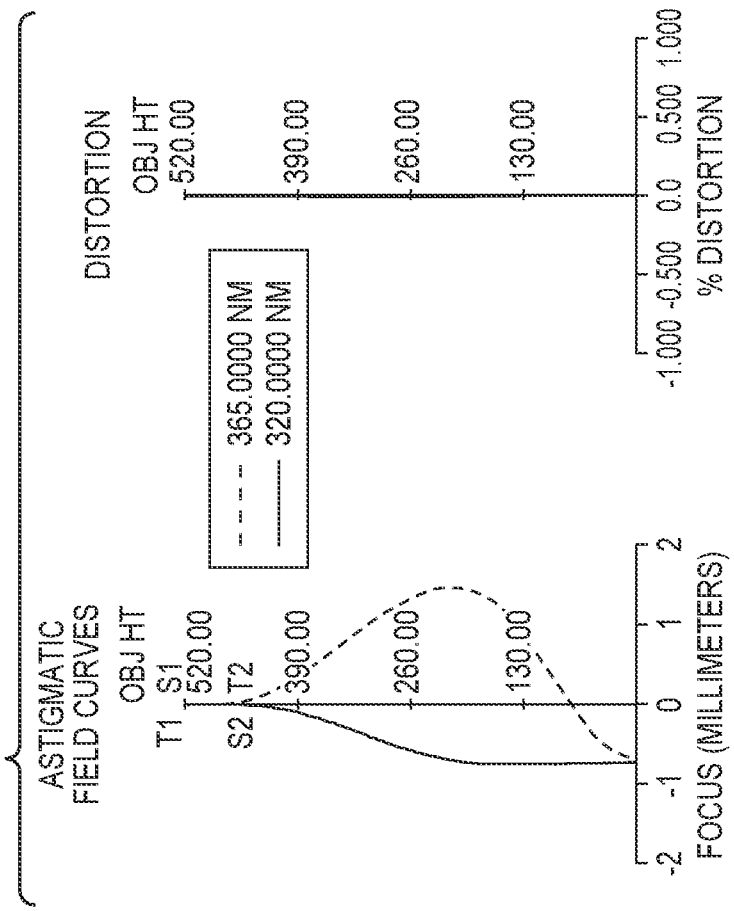

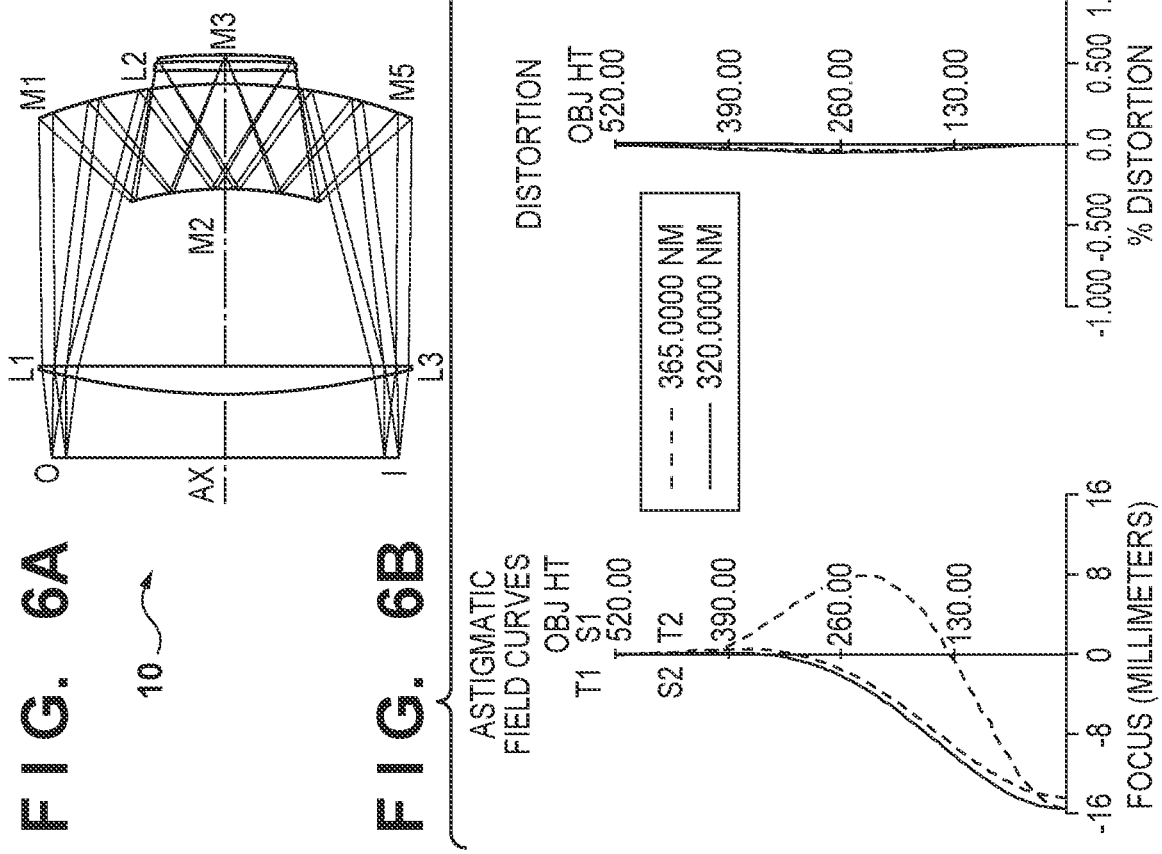

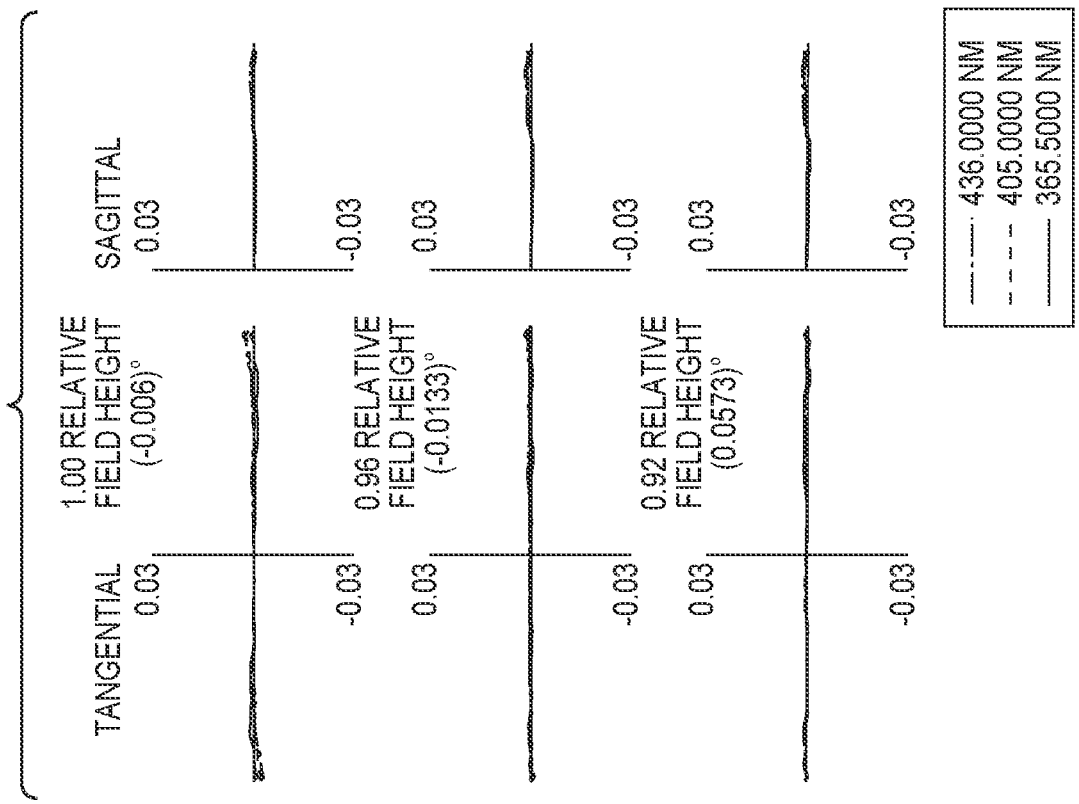
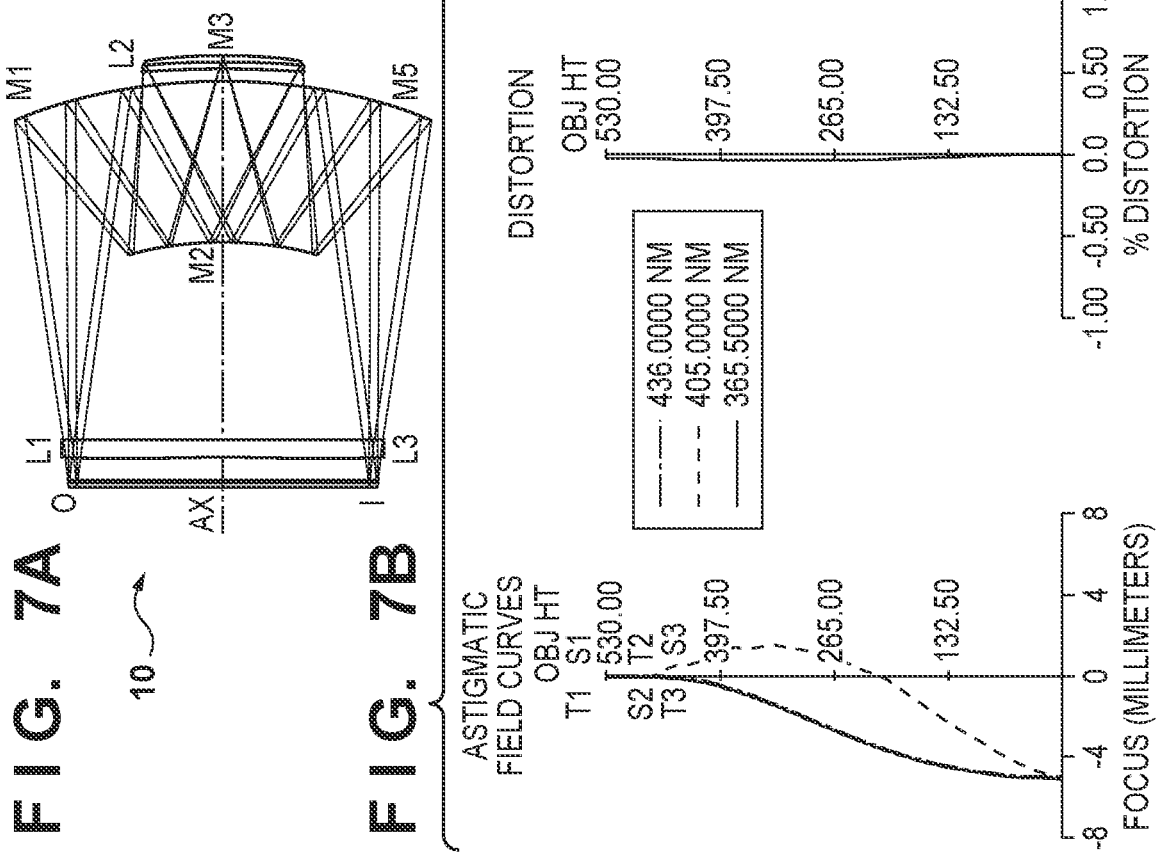

PROJECTION OPTICAL SYSTEM, EXPOSURE APPARATUS, AND ARTICLE MANUFACTURING METHOD

BACKGROUND OF THE INVENTION

Field of the Invention

The present invention relates to a projection optical system, an exposure apparatus, and an article manufacturing method.

Description of the Related Art

Recently, as the HD (High Definition) standardization of television systems advances, many FPDs (Flat Panel Displays) are used as display devices, and demand has arisen for larger screens and lower costs. In the manufacture of the FPD, a photolithography technique is used to project a circuit pattern of a mask (original) onto a substrate coated with a photoresist, and transfer (form) the pattern onto the substrate, as in the manufacture of an integrated circuit (IC).

As an example of a projection optical system for use in this photolithography technique, an equal-magnification optical system using a mirror which forms a finite slit-like region having a corrected aberration is disclosed in each of Japanese Patent Laid-Open Nos. 52-5544 and 7-57986. A pattern can be formed on a two-dimensional wide screen by synchronously scanning an object plane (mask surface) and image plane (substrate surface) with respect to the slit-like region.

In the optical system disclosed in Japanese Patent Laid-Open No. 52-5544, a mask pattern is reflected three times by a concave mirror and convex mirror which are almost concentrically arranged, and further reflected twice by a no-power trapezoidal mirror (that is, the pattern is reflected five times in total), thereby forming an image at equal magnification. In the optical system disclosed in Japanese Patent Laid-Open No. 52-5544, a region which contributes to exposure is an off-axis finite arcuated region. Japanese Patent Laid-Open No. 7-57986 has disclosed a multi-lens optical system formed by arranging a plurality of small-sized, equal-magnification optical systems. This optical system ensures a large-screen area by overlapping adjacent ones of a plurality rectangular regions formed on a substrate. As described above, the projection optical systems used to expose large-sized substrates such as liquid-crystal substrates are roughly classified into a system mainly including two mirrors, that is, a concave mirror and a convex mirror, and a system (so-called Dyson optical system) including a lens and a mirror.

In the optical system disclosed in Japanese Patent Laid-Open No. 52-5544, a mirror has the main power of the optical system, so almost no chromatic aberration is generated. In addition, this optical system has the advantage that a single optical system can expose a large area at once. On the other hand, the concave mirror as a main mirror has a large diameter. However, this optical system poses problems when realizing demand for, for example, the enlargement of a simultaneous exposure region (optically, an arcuated good-image region) in order to improve the optical performance in the future, that is, increase the resolving power by increasing the numerical aperture (NA), and increase the shot size. More specifically, the problems are the enlargement of the optical system and an exposure apparatus including the system, the increases in weight and apparatus-occupied area (footprint), and performance fluctuations caused by heat and vibrations.

The optical system disclosed in Japanese Patent Laid-Open No. 7-57986 can be made small as a whole. However, the resolution decreases in a region where adjacent rectangular regions overlap each other on a substrate, and this deteriorates the uniformity on the whole screen. To prevent the decrease in resolution like this, it is necessary to control the exposure amount, focus, and overlap accuracy, so the difficulty of control increases. Also, since the optical power of each equal-magnification optical system depends on the power of the lens, a chromatic aberration is generated. When compared to the former optical system, therefore, aberration correction has its limit in a wide wavelength band from ultraviolet to far ultraviolet. Furthermore, if exposure is continued by ultraviolet light, the resolution decreases due to heat generation caused by light absorption by the lens or changes in refractive index. This shows the limit of high NA and the limit of short wavelength when increasing the resolving power.

Accordingly, each of Japanese Patent Laid-Open No. 5-53057, U.S. Pat. No. 5,078,502, and Japanese Patent Laid-Open No. 2009-276769 has proposed an optical system which causes reflection five times by using two mirrors, that is, a concave mirror and convex mirror, or an optical system which causes reflection five times by using three mirrors.

The optical system disclosed in Japanese Patent Laid-Open No. 5-53057 has a design solution which can minimize the Petzval sum. However, the degree of freedom of design is insufficient to reduce various aberrations necessary for a projection optical system. In particular, this optical system cannot increase the NA. The various aberrations herein mentioned include, for example, a spherical aberration, an astigmatism, and an image field curvature in an exposure slit.

In the optical systems disclosed in U.S. Pat. No. 5,078,502 and Japanese Patent Laid-Open No. 2009-276769, a mirror positioned on the pupil plane is spaced apart from a main mirror (concave mirror), so the curvatures and locations of the mirrors can freely be determined. This increases the degree of freedom of design compared to the optical system disclosed in Japanese Patent Laid-Open No. 5-53057. Therefore, the aberrations can be reduced even when the NA is increased. In particular, Japanese Patent Laid-Open No. 2009-276769 has disclosed a design example of an optical system in which the mirror positioned on the pupil plane is largely spaced apart from the main mirror. In this design example, however, the total length of the optical system increases even when the distance between the concave mirror and the convex mirror is decreased in order to make the optical system small. An optical system for use in an exposure apparatus is required to decrease the dimensions of both the height and depth, and to be able to correct aberrations with high accuracy.

SUMMARY OF THE INVENTION

The present invention provides a technique advantageous in achieving both a small size and high performance of an optical system.

According to one aspect of the present invention, there is provided a projection optical system comprising a first concave reflecting surface, a first convex reflecting surface, a second concave reflecting surface, and a third concave reflecting surface, wherein the first concave reflecting surface, the first convex reflecting surface, the second concave reflecting surface, and the third concave reflecting surface are arranged such that light from an object plane forms an image on an image plane by being reflected by the first concave reflecting surface, the first convex reflecting surface, the second concave reflecting surface, the first convex reflecting surface, and the third concave reflecting surface in an order named, and letting Lt1 be a distance between the object plane and the second concave reflecting surface, Lt2 be a distance between the second concave reflecting surface and the image plane, Pt1 be a distance between the first concave reflecting surface and the second concave reflecting surface, and Pt2 be a distance between the second concave reflecting surface and the third concave reflecting surface, with no reflecting surface existing between the object plane and the first concave reflecting surface, and between the third concave reflecting surface and the image plane, $0.05 \leq Pt1/Lt1 \leq 0.2$ or $0.05 \leq Pt2/Lt2 \leq 0.2$ is satisfied.

Further features of the present invention will become apparent from the following description of exemplary embodiments with reference to the attached drawings.

BRIEF DESCRIPTION OF THE DRAWINGS

FIGS. 2A to 2C are views for explaining a projection optical system according to Example 2 of the present invention.

FIGS. 3A to 3C are views for explaining a projection optical system according to Example 3 of the present invention.

FIGS. 4A to 4C are views for explaining a projection optical system according to Example 4 of the present invention.

FIGS. 6A to 6C are views for explaining a projection optical system according to Example 6 of the present invention.

FIGS. 7A to 7C are views for explaining a projection optical system according to Example 7 of the present invention.

DESCRIPTION OF THE EMBODIMENTS

Figure 1A:
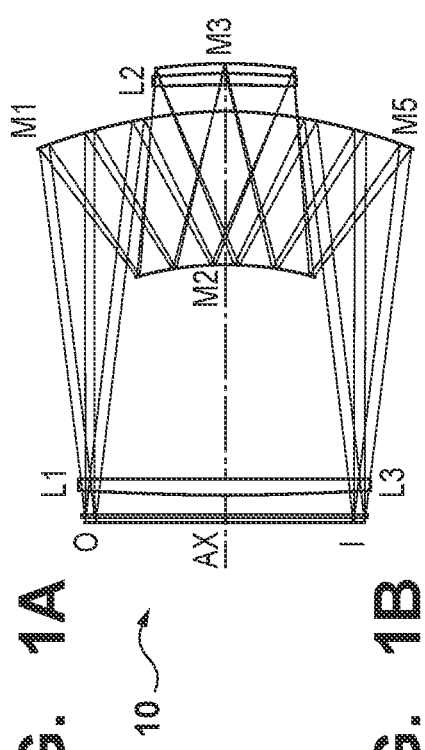
FIGS. 1A to 1C are views for explaining a projection optical system according to Example 1 of the present invention.

Preferred embodiments of the present invention will be described below with reference to the accompanying drawings. Note that the same reference numerals denote the same members throughout the drawings, and a repetitive description thereof will not be given.

Figure 12:
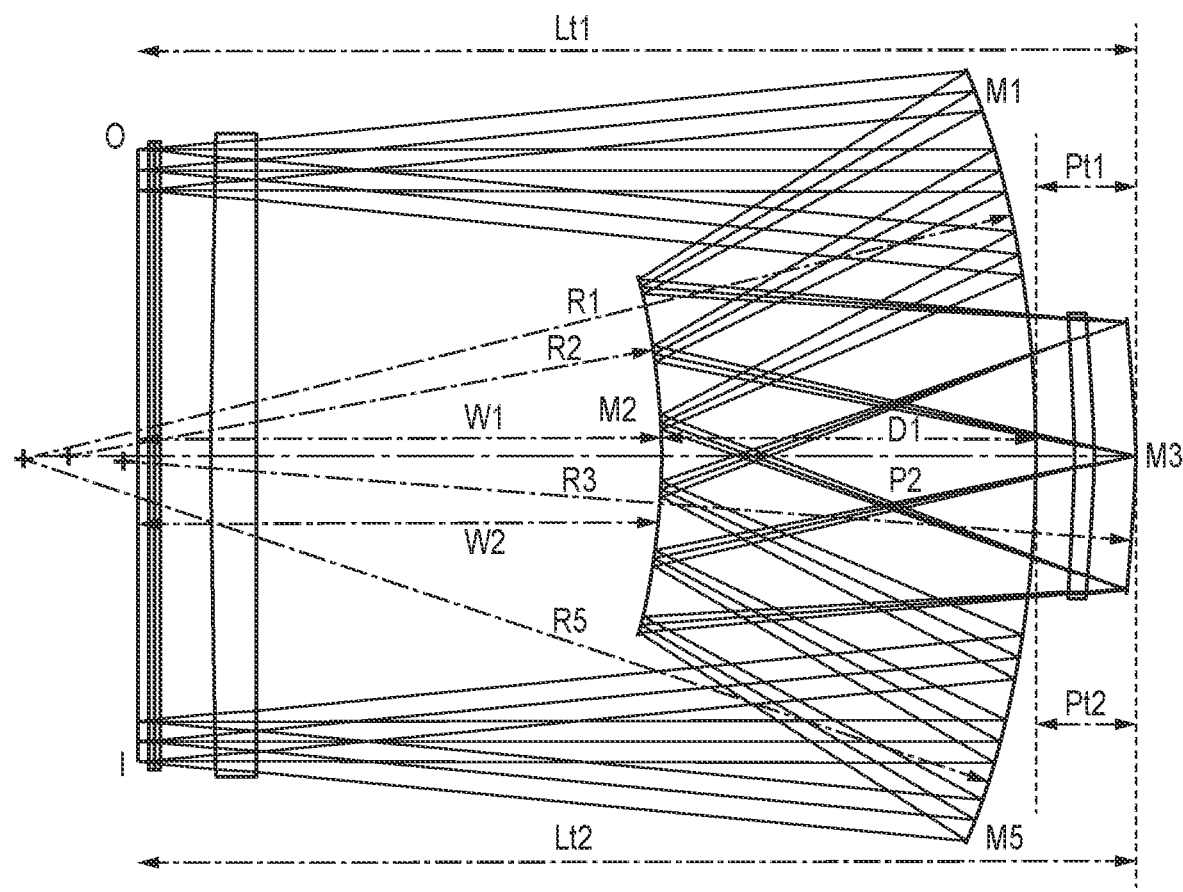
FIG. 12 is a view showing the definitions of dimensions of an optical system according to an embodiment.

This embodiment proposes an optical system which implements both a small size and high performance (accurate aberration correction) when increasing the NA. More specifically, in a three-mirror, five-time-reflection system, the amount of projection of a mirror positioned on the pupil plane from a main mirror, the concentricity of three mirrors, and the distance between an object plane or image plane and the apex (spherical center) of each mirror are defined. By defining these conditions, this embodiment proposes an optical system which increases the degree of freedom of the system by using three mirrors, and decreases the total length, without impairing the advantage of concentric mirror systems (two mirror systems) close to an aplanatic state. The dimensions of this optical system are defined as shown in FIG. 12. Note that a mirror (reflecting surface) can be either horizontally symmetrical or asymmetrical with respect to the optical axis of the optical system, and can also be divided on the left and right sides of the optical axis of the optical system.

The optical system according to this embodiment forms an image of light from an off-axis point of an arcuated object plane onto an arcuated image plane by reflecting the light in the order of a first concave mirror M1, a first convex mirror M2, a second concave mirror M3 (a pupil plane), the first convex mirror M2, and a third concave mirror M5. The first concave mirror M1 functions as a first concave reflecting surface, the first convex mirror M2 functions as a first convex reflecting surface, the second concave mirror M3 functions as a second concave reflecting surface, and the third concave mirror M5 functions as a third concave reflecting surface. The second concave mirror M3 is placed in a position far from the object plane than the first concave mirror M1. Also, the optical system according to this embodiment is basically often used in a state in which a first bending mirror for bending an optical path is placed between the first concave mirror M1 and the object plane, and a second bending mirror is placed between the third concave mirror M5 and the image plane. To facilitate understanding the optical system according to this embodiment, however, an explanation will be made by assuming that the first bending mirror and second bending mirror (no-power mirrors (reflecting surfaces)) do not exist.

Let R1, R2, R3, and R5 respectively be the curvature radii of the first concave mirror M1, first convex mirror M2, second concave mirror M3, and third concave mirror M5. Let D1 be the distance between the first concave mirror M1 and the first convex mirror M2, and D2 be the distance between the first convex mirror M2 and the third concave mirror M5. Let W1 be the distance (working distance) between the object plane (an object plane when there is no first bending mirror) and the first convex mirror M2, and W2 be the distance (working distance) between the image plane (an image plane when there is no second bending mirror) and the first convex mirror M2. Let Lt1 be the distance (optical length) between the object plane and the second concave mirror M3, and Lt2 be the distance (optical length) between the image plane and the second concave mirror M3. Let B be an image formation magnification.

The optical system according to this embodiment satisfies conditions 1, 2, 3, 4, 5, 6, and 7 below.

$0.05 \leq Pt1/Lt1 \leq 0.2$ or $0.05 \leq Pt2/Lt2 \leq 0.2$   Condition 1:

Condition 1 is a condition found design-wise by the present inventor, and defines the projection amount of the pupil plane with respect to the total length of the optical system. One of the most fundamental conditions under which the optical system becomes aplanatic is a state in which power optical elements such as mirrors and lenses are concentrically arranged and an object plane is positioned in the spherical center. When compared to a two-mirror, five-time-reflection system, a three-mirror, five-time-reflection system increases the degree of freedom of design, but tends to deviate from the concentricity between mirrors. Condition 1 achieves both of these conflicting conditions, and means a region where the optical element (the second concave mirror M3 or lens L2) positioned on the pupil plane corrects aberration most effectively. Condition 1 also contributes to decreasing the total length of the optical system.

$$0.70 \leq W1/R2 \leq 1.0 \text{ or } 0.70 \leq W2/R2 \leq 1.0 \quad \text{Condition 2:}$$

Condition 2 defines the concentricity of the first convex mirror M2 (the curvature radius R2) and the object plane. As described above, as the object plane approaches the spherical center of a mirror, the concentricity of the whole optical system increases, and aberrations such as a spherical aberration and halo of an off-axis image height improve. Also, in an actual layout, securing the distance W1 between the object plane and the first convex mirror M2 makes it possible to arrange bending mirrors, and arrange a mask and substrate parallel to each other in an exposure apparatus and synchronously scan them.

$$0.87 \leq (R2+D1)/R1 \leq 1.15 \text{ or } 0.87 \leq (R2+D2)/R5 \leq 1.15 \quad \text{Condition 3:}$$

Condition 3 defines the concentricity of the first concave mirror M1 and first convex mirror M2.

$$0.8 \leq R3/R1 \leq 1.25 \text{ or } 0.8 \leq R3/R5 \leq 1.25 \quad \text{Condition 4:}$$

Condition 4 defines the concentricity of the first concave mirror M1 and second concave mirror M3.

$$0.9 \leq R3/Lt1 \leq 1.1 \text{ or } 0.9 \leq R3/Lt2 \leq 1.1 \quad \text{Condition 5:}$$

Condition 5 defines the concentricity of the second concave mirror M3 and object plane.

As described above, conditions 3, 4, and 5 contribute to improving aberrations such as a spherical aberration.

$$0.5 \leq W1/Lt1 \leq 0.7 \text{ or } 0.5 \leq W2/Lt2 \leq 0.7 \quad \text{Condition 6:}$$

Condition 6 limits the total length (the distances Lt1 and Lt2) of the optical system with respect to the necessary working distance (the distances W1 and W2). When a screen size to be exposed is designated in an exposure apparatus, an exposure width and arcuated image height are determined based on the designated size. A predetermined working distance is required to place a bending mirror which reflects the whole exposure light in the optical path. Condition 6 can limit the total length of the optical system even when the working distance increases.

$$B \times 0.87 \leq (R5/R1) \leq B \times 1.15 \quad \text{Condition 7:}$$

The optical system according to this embodiment includes a lens having an aspherical shape in the vicinity of the object plane and image plane (between the first convex mirror M2 and the object plane and image plane). Also, the optical system according to this embodiment includes a meniscus lens having first and second surfaces curved in the same direction in the vicinity of the second concave mirror M3 (between the first convex mirror M2 and the second concave mirror M3). In the optical system according to this embodiment, at least one of the first concave mirror M1, first convex mirror M2, second concave mirror M3, and third concave mirror M5 has an aspherical shape. The optical system according to this embodiment includes a stop having a variable aperture between the first convex mirror M2 and the second concave mirror M3. The optical system according to this embodiment is telecentric to the object plane side and image plane side.

The following examples demonstrate the validity of the numerical values in conditions 1 to 7. If the lower limits or upper limits of these conditions are exceeded, the concentricity of the optical system breaks, so the resolving power decreases as aberrations worsen. In addition, the size of the optical system increases.

Example 1

FIG. 1A is a sectional view showing the arrangement of a projection optical system 10 of Example 1. The projection optical system 10 includes a first concave mirror M1 having positive power, a first convex mirror M2 having negative power, a second concave mirror M3 having positive power, and a third concave mirror M5 having positive power.

Since the projection optical system 10 is an equal-magnification system in Example 1, the first concave mirror M1 and third concave mirror M5 are optically identical mirrors. Accordingly, the first concave mirror M1 and third concave mirror M5 can be formed by a donut-like integrated mirror having a hollow portion in the middle, and can also be formed by different mirrors.

A lens L1 is placed near an object plane O, and a lens L3 is placed near an image plane I. A lens L2 is placed near the second concave mirror M3. Light from the object plane O forms an image on the image plane I through the lens L1, first concave mirror M1, first convex mirror M2, lens L2, second concave mirror M3, lens L2, first convex mirror M2, third concave mirror M5, and lens L3 in this order. The second concave mirror M3 is placed on the pupil plane of the projection optical system 10. In addition, an aperture stop is placed near the second concave mirror M3. A principal ray of each object image point passing through the center of the optical axis of the projection optical system 10 becomes telecentric on the object plane. The aperture stop may have a mechanism by which the aperture diameter or aperture shape is variable. This makes it possible to set optimum numerical apertures in accordance with various exposure processes. More specifically, when the resolution line width is large, it is possible to obtain a necessary resolving power and widen the depth of focus at the same time by decreasing the aperture diameter of the aperture stop. Note that the second concave mirror M3 itself may have the function of the aperture stop, instead of using the aperture stop in addition to the second concave mirror M3.

The lenses L1 and L3 are not necessarily essential. However, the lenses L1 and L3 are preferably installed as aspherical lenses in order to correct the image field curvature of an off-axis image height and the astigmatism, and expand a good-image region. In this case, these aspherical lenses preferably have practically no power in order to solve the problems of the above-described lens systems. The lens L2 is a so-called meniscus lens (including flat glass having an infinite curvature) having refractive surfaces curved in the same direction. The lens L2 mainly contributes to correcting a chromatic aberration generated by the lenses L1 and L3. The curving direction of the refractive surfaces of the lens L2 is preferably the same direction as that of the second concave mirror M3 from the viewpoint of the concentricity. The lens L2 has practically no power like the lenses L1 and L3, and hence contributes to solving the problems of the above-described lens systems.

Figure 1B:
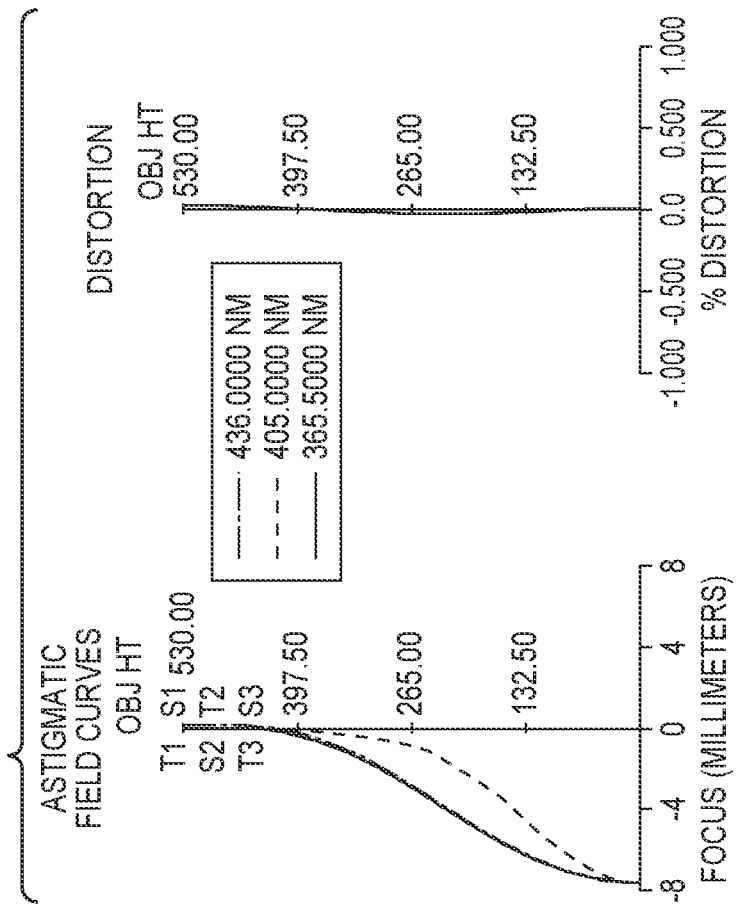
Figure 1C:
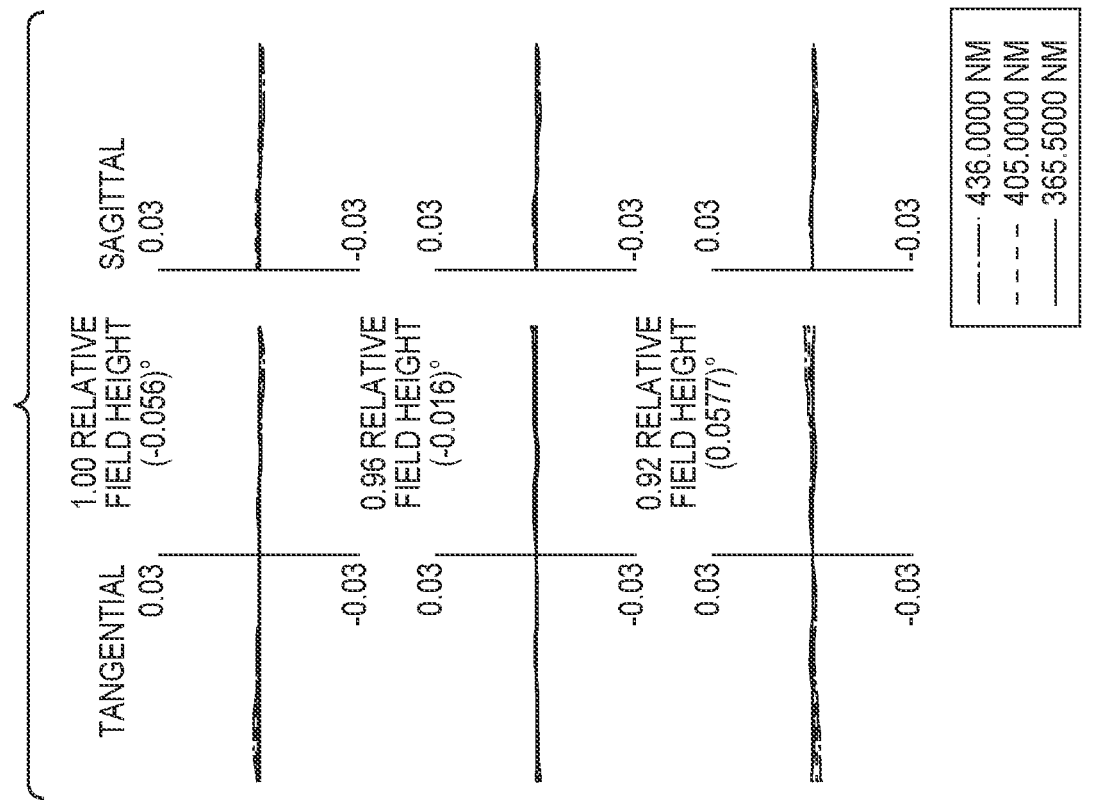

FIG. 1B is a view showing the longitudinal aberration and distortion of the projection optical system 10 of Example 1. FIG. 1C is a view showing the lateral aberration of the projection optical system 10 of Example 1. FIGS. 1B and 1C reveal that the longitudinal aberration and lateral aberration are corrected by the off-axis image height. The projection optical system 10 of Example 1 is an equal-magnification system which is symmetrical with respect to the second concave mirror M3 placed on the pupil plane, so no distortion is basically generated. Also, asymmetrical aberrations such as coma and magnification chromatic aberration are not generated. In addition, since the mirror system has the main optical power of the whole projection optical system 10, chromatic aberrations generated by the lenses L1, L2, and L3 are also substantially small.

Table 1 below shows practical numerical value examples of the projection optical system 10 of Example 1. R is the curvature radius, D is the surface distance, and N is the glass material. A blank of R means a flat surface (the curvature radius is infinite), and a blank of N means that the refractive index is 1. Note that the NA is 0.12 on the object plane side, the correction wavelengths are i-line (365 nm), h-line (405 nm), and g-line (436 nm), and the used image height is 490 to 530 mm. Accordingly, the exposure slit width is 40 mm. This used image height ensures a simultaneous exposure width of 750 mm or more. The projection optical system 10 of Example 1 includes a plurality of aspherical mirror surfaces and a plurality of aspherical lens surfaces, and their coefficients are shown in the lower half of Table 1.

TABLE 1

| Surface number | | R | D | N |
|---|---|---|---|---|
| Object | | | | |
| 1 | | | 18.75 | |
| 2 | | | 11.72 | 'SiO2' |
| 3 | | | 74.59 | |
| 4 | Aspherical | 10463.57 | 59.73 | 'SiO2' |
| 5 | | | 816.66 | |
| 6 | | −1229.02 | 579.45 | |
| 7 | | −1871.68 | −579.45 | Reflecting |
| 8 | Aspherical | −1229.02 | 0 | Reflecting |
| 9 | | | 579.45 | |
| 10 | | −1871.68 | 108.23 | |
| 11 | | −3720.42 | 40 | 'SiO2' |
| 12 | Aspherical | −3648.34 | 10.26 | |
| 13 | | | 28.76 | |
| 14 | Aspherical | −1706.24 | −28.76 | Reflecting |
| 15 | | | −10.26 | |
| 16 | Aspherical | −3648.34 | −40 | 'SiO2' |
| 17 | | −3720.42 | −108.23 | |
| 18 | | | −579.45 | |
| 19 | Aspherical | −1229.02 | 0 | Reflecting |
| 20 | | | 579.45 | |
| 21 | | −1871.68 | −579.45 | Reflecting |
| 22 | | | −816.66 | |
| 23 | | | −59.73 | 'SiO2' |
| 24 | Aspherical | 10463.57 | −74.59 | |
| 25 | | | −11.72 | 'SiO2' |
| 26 | | | −18.75 | |
| Image | | | | |

| Aspherical surface data | | | | | |
|---|---|---|---|---|---|
| Surface number | K | A04 | B06 | C08 | D10 |
| 4 | 1.0510E+00 | 1.0860E−09 | −1.2960E−14 | 7.5870E−20 | −3.0020E−25 |
| 8 | −1.2200E−01 | −9.0750E−12 | −8.0640E−17 | 3.0480E−21 | −7.3390E−26 |
| 12 | 1.0400E+00 | −2.4020E−12 | 1.1800E−16 | −1.3520E−21 | 2.1820E−27 |
| 14 | −3.8300E−01 | −8.6940E−12 | 3.5680E−17 | −7.0450E−21 | 3.6480E−25 |
| 16 | 1.0400E+00 | −2.4020E−12 | 1.1800E−16 | −1.3520E−21 | 2.1820E−27 |
| 19 | −1.2200E−01 | −9.0750E−12 | −8.0640E−17 | 3.0480E−21 | −7.3390E−26 |
| 24 | 1.0510E+00 | 1.0860E−09 | −1.2960E−14 | 7.5870E−20 | −3.0020E−25 |
| Surface number | E12 | F14 | G16 | H18 | J20 |
| 4 | 8.0560E−31 | −1.2580E−36 | 5.3720E−43 | 1.3540E−48 | −1.5950E−54 |
| 8 | 1.1120E−30 | −1.0680E−35 | 6.2720E−41 | −2.0500E−46 | 2.8490E−52 |
| 12 | 1.2790E−31 | −8.0870E−38 | −7.4360E−42 | −1.6870E−46 | 1.7250E−51 |
| 14 | −1.0800E−29 | 1.9740E−34 | −2.2080E−39 | 1.3910E−44 | −3.7840E−50 |
| 16 | 1.2790E−31 | −8.0870E−38 | −7.4360E−42 | −1.6870E−46 | 1.7250E−51 |
| 19 | 1.1120E−30 | −1.0680E−35 | 6.2720E−41 | −2.0500E−46 | 2.8490E−52 |
| 24 | 8.0560E−31 | −1.2580E−36 | 5.3720E−43 | 1.3540E−48 | −1.5950E−54 |

An aspherical surface is represented by $z=rh^2/(1+(1-(1+k)r^2h^2)^{1/2})+Ah^4+Bh^6+Ch^8+Dh^{10}+Eh^{12}+Fh^{14}+Gh^{16}$.

Figure 13B:
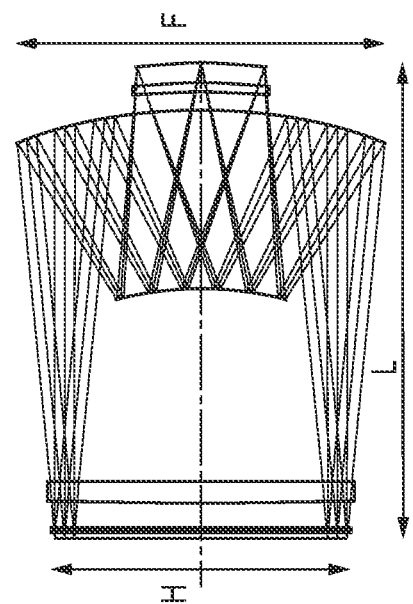
FIGS. 13A and 13B are views for explaining the sizes of optical systems.
Figure 13A:
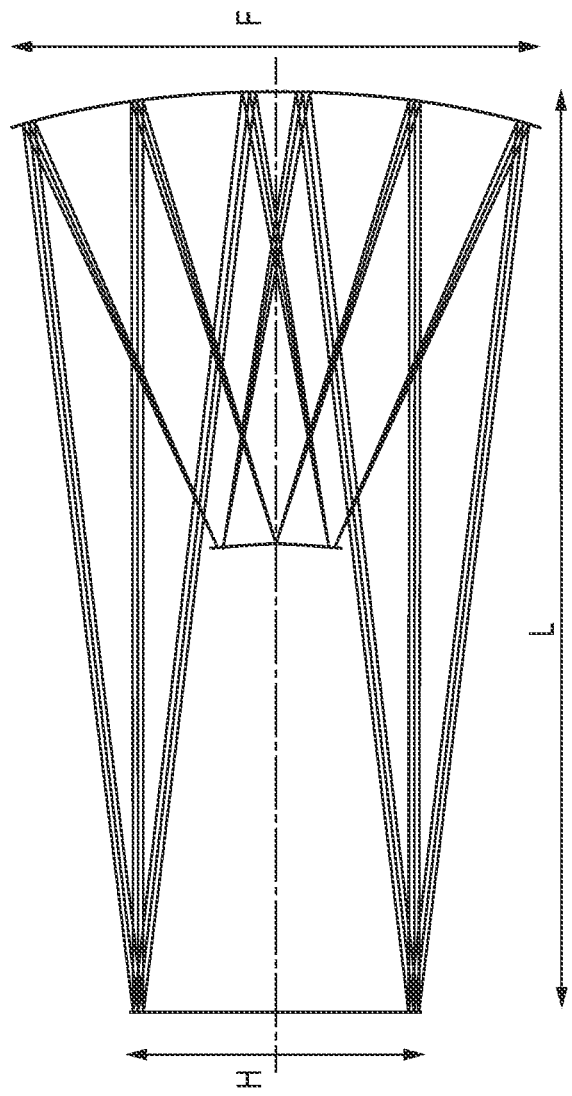

Comparison of the sizes of optical systems will be explained below. FIG. 13A is a view showing a section of a conventional optical system including two mirrors, and FIG. 13B is a view showing a section of the projection optical system 10 of Example 1. The conventional two-mirror optical system and the projection optical system 10 of Example 1 are designed by the same specifications, and illustrated in the same scale. Under equal conditions in which an object image distance H is 1,060 mm, therefore, a diameter F of the largest concave mirror as a main mirror is 41,964 mm in the prior art, and 41,410 mm (72% of the prior art) in Example 1. Also, the total length L of the optical system is 3,459 mm in the prior art, and 1,744 mm (50% of the prior art) in Example 1. Thus, the height and total length of the projection optical system 10 of Example 1 are sufficiently small.

The projection optical system 10 of Example 1 satisfies the following conditions:
As condition 1, pupil projection amount (Pt/Lt1)=0.11
As condition 2, working distance (W1/R2)=0.80
As condition 3, concentricity ((R2+D)/R1)=0.97
As condition 4, concentricity (R3/R1)=0.91
As condition 5, concentricity (R3/Lt1)=0.98
As condition 6, working distance (W1/Lt1)=0.56

Figure 14:
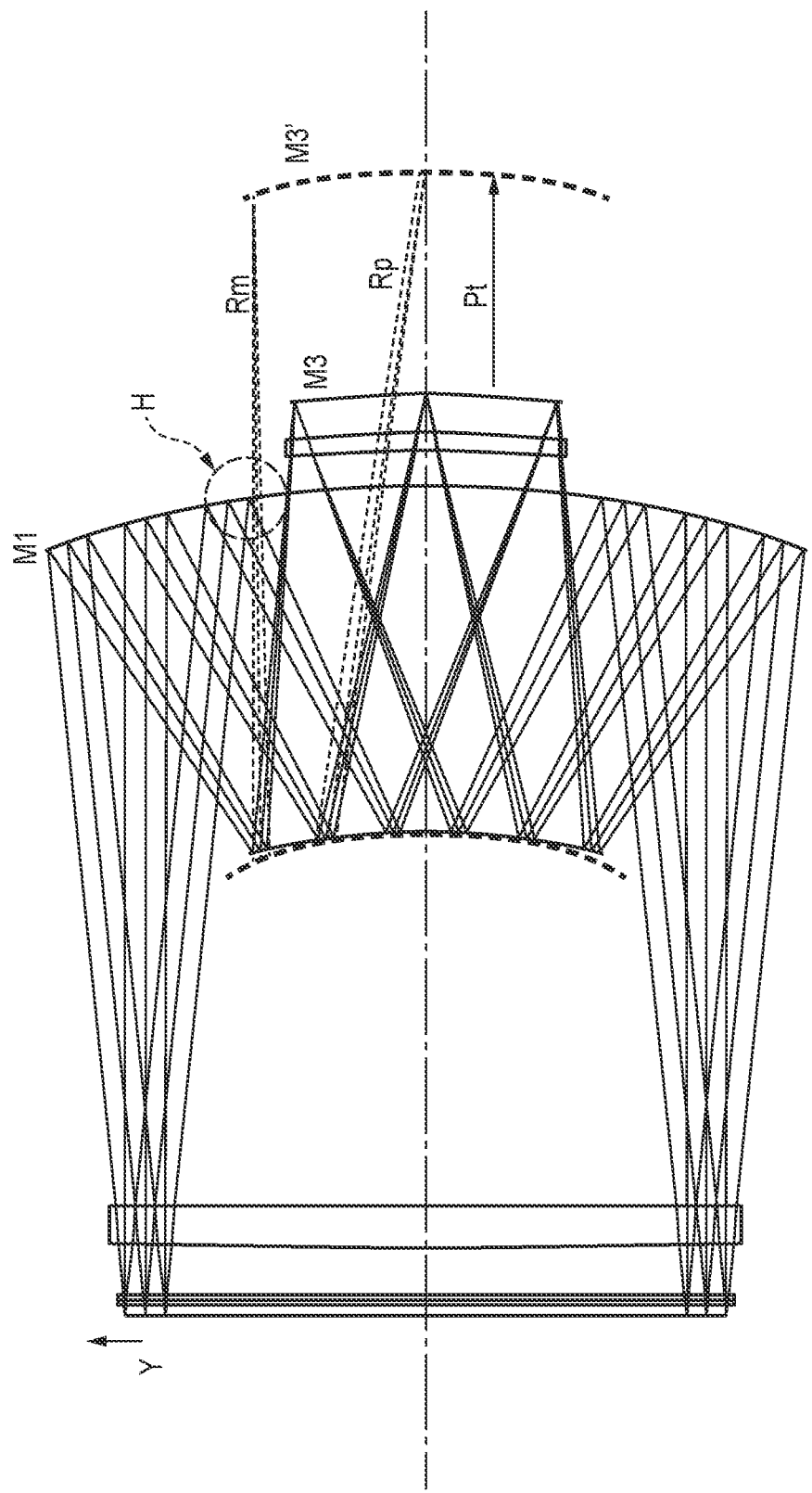
FIG. 14 is a view for explaining influences which the pupil projection amount has on an aberration and the size of the optical system.

The influences which the pupil projection amount under condition 1 design-wise has on aberrations and the size of the optical system will be explained with reference to FIG. 14. Referring to FIG. 14, when increasing the pupil projection amount Pt, for example, when moving the second concave mirror M3 to a position M3', it is necessary to decrease the inclination angles of a principal ray Rp and a marginal ray Rm with respect to the optical axes. If the curvature of the first convex mirror M2 is decreased, the marginal ray Rm interferes with the effective diameter of the first concave mirror M1, as indicated by H in FIG. 14. Since an object height Y must be increased in order to avoid this interference, the effective diameter of the first concave mirror M1 increases. Thus, the optical system enlarges in both the directions of height and depth when the pupil projection amount Pt increases. Also, the aberrations themselves tend to worsen because they are corrected with the large object height while avoiding the interference.

In the projection optical system 10 of Example 1, therefore, the ratio (Pt/Lt) of the pupil projection amount Pt to the total length L is set at 5% or more and 20% or less. The lower limit is set to allow the projection optical system 10 to sufficiently achieve the degree of freedom of design as a three-mirror optical system. This will be implemented in the following examples, particularly, in Examples 2 and 3.

Example 2

FIG. 2A is a sectional view showing the arrangement of a projection optical system 10 of Example 2. In Example 2, the projection optical system 10 is an equal-magnification system. The layout and image formation relationship of optical elements in the projection optical system 10 of Example 2 are the same as those of Example 1.

Table 2 below shows practical numerical value examples of the projection optical system 10 of Example 2. Note that the NA is 0.12 on the object plane side, the correction wavelength is i-line (365 nm), 320 nm, and the used image height is 20 to 520 mm. Accordingly, the exposure slit width is 40 mm. This used image height ensures a simultaneous exposure width of 750 mm or more. The projection optical system 10 of Example 2 includes a plurality of aspherical mirror surfaces and a plurality of aspherical lens surfaces.

TABLE 2

| Surface number | | R | D | N |
|---|---|---|---|---|
| Object | | | 0 | |
| 1 | | | 23 | |
| 2 | | | 6 | 'SiO2' |
| 3 | | | 220 | |
| 4 | Aspherical | −820.87 | 29.22 | 'SiO2' |
| 5 | Aspherical | −1335.63 | 134 | |
| 6 | | | 640 | |
| 7 | | −1175.42 | 473.14 | |
| 8 | | −1668.57 | −473.14 | Reflecting |
| 9 | | −1175.42 | 473.14 | Reflecting |
| 10 | | −1668.57 | 260 | |
| 11 | Aspherical | −2495.35 | 30 | 'SiO2' |
| 12 | Aspherical | −2490.48 | 90 | |
| 13 | Aspherical | −1878.71 | −90 | Reflecting |
| 14 | Aspherical | −2490.48 | −30 | 'SiO2' |
| 15 | Aspherical | −2495.35 | −260 | |
| 16 | | | −473.14 | |
| 17 | | −1175.42 | 473.14 | Reflecting |
| 18 | | −1668.57 | −473.14 | Reflecting |
| 19 | | | −640 | |
| 20 | | | −134 | |
| 21 | Aspherical | −1335.63 | −29.22 | 'SiO2' |
| 22 | Aspherical | −820.87 | −220 | |
| 23 | | | −6 | 'SiO2' |
| 24 | | | −23 | |
| Image | | | | |

| Aspherical surface data | | | | | |
|---|---|---|---|---|---|
| Surface number | K | A04 | B06 | C08 | D10 |
| 4 | 5.1210E−01 | 4.8730E−09 | −1.7910E−14 | 6.8300E−20 | −2.9110E−25 |
| 5 | 3.2210E+00 | 2.2640E−09 | −1.3770E−15 | −1.6940E−20 | 2.6460E−26 |
| 11 | 4.0000E+00 | −2.7440E−10 | −3.9510E−15 | −4.6580E−22 | 2.1590E−25 |
| 12 | 2.5550E+00 | −1.9420E−10 | −5.5920E−15 | 1.1670E−20 | 1.2040E−25 |
| 13 | 2.8130E−01 | −2.4860E−11 | 7.3410E−16 | −7.5900E−21 | 2.9780E−25 |
| 14 | 2.5550E+00 | −1.9420E−10 | −5.5920E−15 | 1.1670E−20 | 1.2040E−25 |
| 15 | 4.0000E+00 | −2.7440E−10 | −3.9510E−15 | −4.6580E−22 | 2.1590E−25 |

TABLE 2-continued

| | | | | | |
|---|---|---|---|---|---|
| 21 | 3.2210E+00 | 2.2640E−09 | −1.3770E−15 | −1.6940E−20 | 2.6460E−26 |
| 22 | 5.1210E−01 | 4.8730E−09 | −1.7910E−14 | 6.8300E−20 | −2.9110E−25 |

| Surface number | E12 | F14 | G16 | H18 | J20 |
|---|---|---|---|---|---|
| 4 | 8.2960E−31 | −1.1790E−36 | 5.9500E−43 | 1.9040E−49 | 1.1280E−55 |
| 5 | 7.8500E−32 | −1.9450E−37 | −6.0680E−44 | 6.5160E−49 | −4.6160E−55 |
| 11 | 4.7830E−30 | −2.0090E−35 | −6.0850E−40 | 5.5390E−46 | 4.3970E−50 |
| 12 | 5.1290E−30 | 1.8800E−35 | −9.3170E−40 | −2.8390E−45 | 8.0400E−50 |
| 13 | −9.8600E−30 | 1.8550E−34 | −2.4320E−39 | 2.0590E−44 | −8.0080E−50 |
| 14 | 5.1290E−30 | 1.8800E−35 | −9.3170E−40 | −2.8390E−45 | 8.0400E−50 |
| 15 | 4.7830E−30 | −2.0090E−35 | −6.0850E−40 | 5.5390E−46 | 4.3970E−50 |
| 21 | 7.8500E−32 | −1.9450E−37 | −6.0680E−44 | 6.5160E−49 | −4.6160E−55 |
| 22 | 8.2960E−31 | −1.1790E−36 | 5.9500E−43 | 1.9040E−49 | 1.1280E−55 |

The projection optical system 10 of Example 2 satisfies the following conditions:
As condition 1, pupil projection amount (Pt/Lt1)=0.20
As condition 2, working distance (W1/R2)=0.90
As condition 3, concentricity ((R2+D)/R1)=0.99
As condition 4, concentricity (R3/R1)=1.13
As condition 5, concentricity (R3/Lt1)=0.99
As condition 6, working distance (W1/Lt1)=0.55

FIG. 2B is a view showing the longitudinal aberration and distortion of the projection optical system 10 of Example 2. FIG. 2C is a view showing the lateral aberration of the projection optical system 10 of Example 2. FIGS. 2B and 2C demonstrate that the longitudinal aberration and lateral aberration are well corrected. The distortion is parallel to the axis of ordinate within the range of the off-axis used image height, and this shows that a constant magnification is generated in an exposure slit. Since the projection optical system 10 of Example 2 is an equal-magnification system having a symmetrical layout, the distortion should be zero. Strictly speaking, however, telecentric is generated on an order of about 0.001 rad. When an optimum image plane position where the aberrations are minimized moves by a slight amount in the optical-axis direction, an image formation point is shifted by the product of the two, and the magnification changes. As a consequence, the distortion shifts from the axis of ordinate. This phenomenon can easily be eliminated by optimization, so the slight magnification shift is not a problem. What is important is that the magnification is constant in the exposure slit. Therefore, even if multiple exposure is performed on a mask pattern in the exposure slit when scanning a mask and substrate, a transfer image to the substrate does not shift, so a high-contrast image can be formed.

Example 3

FIG. 3A is a sectional view showing the arrangement of a projection optical system 10 of Example 3. In Example 3, the projection optical system 10 is an equal-magnification system. The layout and image formation relationship of optical elements in the projection optical system 10 of Example 3 are the same as those of Example 1.

Table 3 below shows practical numerical value examples of the projection optical system 10 of Example 3. Note that the NA is 0.12 on the object plane side, the correction wavelength is i-line (365 nm), 320 nm, and the used image height is 480 to 520 mm. Accordingly, the exposure slit width is 40 mm. This used image height ensures a simultaneous exposure width of 750 mm or more. The projection optical system 10 of Example 3 includes a plurality of aspherical mirror surfaces and a plurality of aspherical lens surfaces.

TABLE 3

| Surface number | | R | D | N |
|---|---|---|---|---|
| Object | | | 0 | |
| 1 | | | 25 | |
| 2 | | | 6 | 'SiO2' |
| 3 | | | 220 | |
| 4 | Aspherical | −832.37 | 46.65 | 'SiO2' |
| 5 | Aspherical | −1332 | 134 | |
| 6 | | | 640 | |
| 7 | | −1195.13 | 579.43 | |
| 8 | | −1810.07 | −579.43 | Reflecting |
| 9 | | −1195.13 | 579.43 | Reflecting |
| 10 | | −1810.07 | 30 | |
| 11 | Aspherical | −1925.69 | 35.67 | 'SiO2' |
| 12 | Aspherical | −1928.46 | 20 | |
| 13 | Aspherical | −1689 | −20 | Reflecting |
| 14 | Aspherical | −1928.46 | −35.67 | 'SiO2' |
| 15 | Aspherical | −1925.69 | −30 | |
| 16 | | | −579.43 | |
| 17 | | −1195.13 | 579.43 | Reflecting |
| 18 | | −1810.07 | −579.43 | Reflecting |
| 19 | | | −640 | |
| 20 | | | −134 | |
| 21 | Aspherical | −1332 | −46.65 | 'SiO2' |
| 22 | Aspherical | −832.37 | −220 | |

TABLE 3-continued

| | | | | |
|---|---|---|---|---|
| 23 | | | −6 | 'SiO2' |
| 24 | | | −25 | |
| Image | | | | |

| Aspherical surface data | | | | |
|---|---|---|---|---|
| Surface number | K | A04 | B06 | C08 | D10 |
| 4 | 5.4470E−01 | 4.8280E−09 | −1.6900E−14 | 6.9290E−20 | −2.9210E−25 |
| 5 | 2.9050E+00 | 2.4730E−09 | −1.2060E−15 | −1.6580E−20 | 2.7150E−26 |
| 11 | 4.7310E−01 | 3.9170E−11 | −5.0760E−16 | 5.0060E−21 | −1.8330E−25 |
| 12 | −1.0650E+00 | 8.8510E−12 | −4.4940E−16 | 6.1330E−21 | −2.1910E−25 |
| 13 | −3.8330E−01 | −1.0320E−11 | 4.5670E−17 | −5.7730E−22 | 3.0310E−25 |
| 14 | −1.0650E+00 | 8.8510E−12 | −4.4940E−16 | 6.1330E−21 | −2.1910E−25 |
| 15 | 4.7310E−01 | 3.9170E−11 | −5.0760E−16 | 5.0060E−21 | −1.8330E−25 |
| 21 | 2.9050E+00 | 2.4730E−09 | −1.2060E−15 | −1.6580E−20 | 2.7150E−26 |
| 22 | 5.4470E−01 | 4.8280E−09 | −1.6900E−14 | 6.9290E−20 | −2.9210E−25 |

| Surface number | E12 | F14 | G16 | H18 | J20 |
|---|---|---|---|---|---|
| 4 | 8.2360E−31 | −1.1950E−36 | 5.8080E−43 | 2.2010E−49 | 1.0410E−55 |
| 5 | 7.7910E−32 | −2.0380E−37 | −1.0240E−43 | 5.9400E−49 | −2.9300E−55 |
| 11 | 2.7380E−30 | −6.2880E−36 | −3.2960E−40 | 3.3670E−45 | −6.8240E−51 |
| 12 | 2.4730E−30 | 1.5760E−35 | −5.3090E−40 | 2.0290E−45 | 1.2230E−50 |
| 13 | −9.4210E−39 | 1.8990E−34 | −2.4820E−39 | 1.9210E−44 | −6.6390E−50 |
| 14 | 2.4730E−30 | 1.5760E−35 | −5.3090E−40 | 2.0290E−45 | 1.2230E−50 |
| 15 | 2.7380E−30 | −6.2880E−36 | −3.2960E−40 | 3.3670E−45 | −6.8240E−51 |
| 21 | 7.7910E−32 | −2.0380E−37 | −1.0240E−43 | 5.9400E−49 | −2.9300E−55 |
| 22 | 8.2360E−31 | −1.1950E−36 | 5.8080E−43 | 2.2010E−49 | 1.0410E−55 |

The projection optical system 10 of Example 3 satisfies the following conditions:
As condition 1, pupil projection amount (Pt/Lt1)=0.05
As condition 2, working distance (W1/R2)=0.90
As condition 3, concentricity ((R2+D)/R1)=0.98
As condition 4, concentricity (R3/R1)=0.93
As condition 5, concentricity (R3/Lt1)=0.97
As condition 6, working distance (W1/Lt1)=0.62

FIG. 3B is a view showing the longitudinal aberration and distortion of the projection optical system 10 of Example 3. FIG. 3C is a view showing the lateral aberration of the projection optical system 10 of Example 3.

Example 4

FIG. 4A is a sectional view showing the arrangement of a projection optical system 10 of Example 4. In Example 4, the projection optical system 10 is an equal-magnification system. The layout and image formation relationship of optical elements in the projection optical system 10 of Example 4 are the same as those of Example 1.

Table 4 below shows practical numerical value examples of the projection optical system 10 of Example 4. Note that the NA is 0.12 on the object plane side, the correction wavelength is i-line (365 nm), 320 nm, and the used image height is 480 to 520 mm. Accordingly, the exposure slit width is 40 mm. This used image height ensures a simultaneous exposure width of 750 mm or more. The projection optical system 10 of Example 4 includes a plurality of aspherical mirror surfaces and a plurality of aspherical lens surfaces.

TABLE 4

| Surface number | | R | D | N |
|---|---|---|---|---|
| Object | | | 0 | |
| 1 | | | 100.12 | |
| 2 | Aspherical | −5213.78 | 74.91 | 'SiO2' |
| 3 | | | 727.09 | |
| 4 | | −1180.07 | 592.51 | |
| 5 | Aspherical | −1842.72 | −592.51 | Reflecting |
| 6 | Aspherical | −1180.07 | 592.51 | Reflecting |
| 7 | | −1842.72 | 59.19 | |
| 8 | | −2949.6 | 30 | 'SiO2' |
| 9 | | −2894.7 | 30.96 | |
| 10 | Aspherical | −1582.26 | −30.96 | Reflecting |
| 11 | | −2894.7 | −30 | 'SiO2' |
| 12 | | −2949.6 | −59.19 | |
| 13 | | | −592.51 | |
| 14 | Aspherical | −1180.07 | 592.51 | Reflecting |
| 15 | Aspherical | −1842.72 | −592.51 | Reflecting |
| 16 | | | −727.09 | |
| 17 | | | −74.91 | 'SiO2' |
| 18 | Aspherical | −5213.78 | −100.12 | |
| Image | | | | |

TABLE 4-continued

Aspherical surface data

| Surface number | K | A04 | B06 | C08 | D10 |
|---|---|---|---|---|---|
| 2 | 2.6980E+00 | 1.7300E−09 | −1.5360E−14 | 9.1290E−20 | −3.9150E−25 |
| 5 | −3.8090E−03 | 4.0110E−13 | −6.7150E−19 | −3.0660E−26 | 5.6830E−32 |
| 6 | −4.3570E−02 | −3.7170E−12 | −8.3110E−17 | 3.4030E−21 | −9.7850E−26 |
| 10 | −3.0960E−01 | −1.1840E−11 | 1.2000E−16 | −1.0790E−20 | 5.2760E−25 |
| 14 | −4.3570E−02 | −3.7170E−12 | −8.3110E−17 | 3.4030E−21 | −9.7850E−26 |
| 15 | −3.8090E−03 | 4.0110E−13 | −6.7150E−19 | −3.0660E−26 | 5.6830E−32 |
| 18 | 2.6980E+00 | 1.7300E−09 | −1.5360E−14 | 9.1290E−20 | −3.9150E−25 |

| Surface number | E12 | F14 | G16 | H18 | J20 |
|---|---|---|---|---|---|
| 2 | 1.1190E−30 | −1.8070E−36 | 8.3810E−43 | 1.6740E−48 | −1.9230E−54 |
| 5 | −5.4020E−37 | −2.3680E−42 | 1.5460E−48 | 9.1220E−54 | −1.0480E−59 |
| 6 | 1.7150E−30 | −1.8910E−35 | 1.2730E−40 | −4.7560E−46 | 7.5240E−52 |
| 10 | −1.5750E−29 | 2.9300E−34 | −3.3230E−39 | 2.1040E−44 | −5.7100E−50 |
| 14 | 1.7150E−30 | −1.8910E−35 | 1.2730E−40 | −4.7560E−46 | 7.5240E−52 |
| 15 | −5.4020E−37 | −2.3680E−42 | 1.5460E−48 | 9.1220E−54 | −1.0480E−59 |

The projection optical system 10 of Example 4 satisfies the following conditions:
As condition 1, pupil projection amount (Pt/Lt1)=0.14
As condition 2, working distance (W1/R2)=0.84
As condition 3, concentricity ((R2+D)/R1)=0.87
As condition 4, concentricity (R3/R1)=0.80
As condition 5, concentricity (R3/Lt1)=0.89
As condition 6, working distance (W1/Lt1)=0.57

FIG. 4B is a view showing the longitudinal aberration and distortion of the projection optical system 10 of Example 4. FIG. 4C is a view showing the lateral aberration of the projection optical system 10 of Example 4.

In Example 4, condition 3 is 0.87, and condition 4 is 0.80. However, these values are 1.0 if the concentricity is perfect. From the viewpoint of defining allowable values of deviation from the concentricity, equivalent allowable ranges exist even for 1.0 or more. For example, 1/0.87=1.15 is set as an upper limit for condition 3, and 1/0.80=1.25 is set as an upper limit for condition 4.

Example 5

Figure 5A:
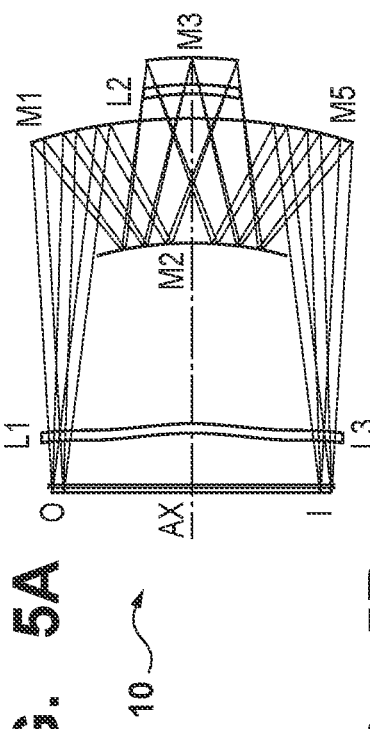
FIGS. 5A to 5C are views for explaining a projection optical system according to Example 5 of the present invention.

FIG. 5A is a sectional view showing the arrangement of a projection optical system 10 of Example 5. In Example 5, the projection optical system 10 is an equal-magnification system. The layout and image formation relationship of optical elements in the projection optical system 10 of Example 5 are the same as those of Example 1.

Table 5 below shows practical numerical value examples of the projection optical system 10 of Example 5. Note that the NA is 0.08 on the object plane side, the correction wavelength is i-line (365 nm), 320 nm, and the used image height is 480 to 520 mm. Accordingly, the exposure slit width is 40 mm. This used image height ensures a simultaneous exposure width of 750 mm or more. The projection optical system 10 of Example 5 includes a plurality of aspherical mirror surfaces and a plurality of aspherical lens surfaces.

TABLE 5

| Surface number | | R | D | N |
|---|---|---|---|---|
| Object | | | 0 | |
| 1 | | | 23 | |
| 2 | | | 6 | 'SiO2' |
| 3 | | | 220 | |
| 4 | Aspherical | −846.36 | 43.23 | 'SiO2' |
| 5 | Aspherical | −1314.35 | 134 | |
| 6 | | | 640 | |
| 7 | | −1267.88 | 530.4 | |
| 8 | Aspherical | −2067.32 | −530.4 | Reflecting |
| 9 | Aspherical | −1267.88 | 530.4 | Reflecting |
| 10 | | −2067.32 | 104.38 | |
| 11 | Aspherical | −1027.49 | 46.33 | 'SiO2' |
| 12 | Aspherical | −1067.49 | 47.85 | |
| 13 | | | 64.64 | |
| 14 | Aspherical | −1648.77 | −64.64 | Reflecting |
| 15 | | | −47.85 | |
| 16 | Aspherical | −1067.49 | −46.33 | 'SiO2' |
| 17 | Aspherical | −1027.49 | −104.38 | |
| 18 | | | −530.4 | |
| 19 | Aspherical | −1267.88 | 530.4 | Reflecting |
| 20 | Aspherical | −2067.32 | −530.4 | Reflecting |
| 21 | | | −640 | |
| 22 | | | −134 | |
| 23 | Aspherical | −1314.35 | −43.23 | 'SiO2' |
| 24 | Aspherical | −846.36 | −220 | |

TABLE 5-continued

| | | | | |
|---|---|---|---|---|
| 25 | | | −6 | 'SiO2' |
| 26 | | | −23 | |
| Image | | | | |

| Aspherical surface data | | | | | |
|---|---|---|---|---|---|
| Surface number | K | A04 | B06 | C08 | D10 |
| 4 | 6.9750E−01 | 4.9420E−09 | −1.7410E−14 | 6.8640E−20 | −2.9260E−25 |
| 5 | 3.0400E+00 | 2.3420E−09 | −1.6620E−15 | −1.6510E−20 | 2.6880E−26 |
| 8 | 1.1910E+00 | −3.8790E−11 | 3.8430E−21 | 1.2080E−23 | 2.8790E−29 |
| 9 | 3.6720E+00 | −3.6420E−10 | −8.8140E−16 | 5.5570E−21 | −9.3910E−27 |
| 11 | 4.0000E+00 | −1.7110E−09 | −1.3850E−14 | −2.8380E−20 | 1.4300E−24 |
| 12 | 4.0000E+00 | −1.4500E−09 | −1.1330E−14 | −3.3630E−22 | 1.0650E−24 |
| 14 | 1.0540E+00 | −4.9320E−11 | 2.6280E−16 | −3.9220E−21 | −5.3160E−26 |
| 16 | 4.0000E+00 | −1.4500E−09 | −1.1330E−14 | −3.3630E−22 | 1.0650E−24 |
| 17 | 4.0000E+00 | −1.7110E−09 | −1.3850E−14 | −2.8380E−20 | 1.4300E−24 |
| 19 | 3.6720E+00 | −3.6420E−10 | −8.8140E−16 | 5.5570E−21 | −9.3910E−27 |
| 20 | 1.1910E+00 | −3.8790E−11 | 3.8430E−21 | 1.2080E−23 | 2.8790E−29 |
| 23 | 3.0400E+00 | 2.3420E−09 | −1.6620E−15 | −1.6510E−20 | 2.6880E−26 |
| 24 | 6.9750E−01 | 4.9420E−09 | −1.7410E−14 | 6.8640E−20 | −2.9260E−25 |
| Surface number | E12 | F14 | G16 | H18 | J20 |
| 4 | 8.2490E−31 | −1.1960E−36 | 5.8740E−43 | 2.1330E−49 | −5.2590E−56 |
| 5 | 7.9670E−32 | −2.0470E−37 | −1.1070E−43 | 4.8480E−49 | −1.5680E−55 |
| 8 | −7.0510E−35 | 1.0870E−41 | 8.3410E−47 | 1.0780E−52 | −3.3780E−58 |
| 9 | −4.8590E−31 | 4.8830E−37 | 2.0020E−40 | −2.7300E−45 | 1.0400E−50 |
| 11 | −1.5750E−29 | −1.3560E−33 | 3.2810E−38 | 1.1110E−42 | −2.2530E−47 |
| 12 | −2.5350E−29 | −2.1120E−35 | −9.0470E−40 | 1.2730E−42 | −2.0370E−47 |
| 14 | 5.5150E−30 | 2.3210E−35 | −1.2180E−38 | 3.0500E−43 | −2.4270E−48 |
| 16 | −2.5350E−29 | −2.1120E−35 | −9.0470E−40 | 1.2730E−42 | −2.0370E−47 |
| 17 | −1.5750E−29 | −1.3560E−33 | 3.2810E−38 | 1.1110E−42 | −2.2530E−47 |
| 19 | −4.8590E−31 | 4.8830E−37 | 2.0020E−40 | −2.7300E−45 | 1.0400E−50 |
| 20 | −7.0510E−35 | 1.0870E−41 | 8.3410E−47 | 1.0780E−52 | −3.3780E−58 |
| 23 | 7.9670E−32 | −2.0470E−37 | −1.1070E−43 | 4.8480E−49 | −1.5680E−55 |
| 24 | 8.2490E−31 | −1.1960E−36 | 5.8740E−43 | 2.1330E−49 | −5.2590E−56 |

The projection optical system 10 of Example 5 satisfies the following conditions:
As condition 1, pupil projection amount (Pt/Lt1)=0.07
As condition 2, working distance (W1/R2)=0.76
As condition 3, concentricity ((R2+D)/R1)=0.96
As condition 4, concentricity (R3/R1)=0.86
As condition 5, concentricity (R3/Lt1)=0.98
As condition 6, working distance (W1/Lt1)=0.56

Figure 5C:
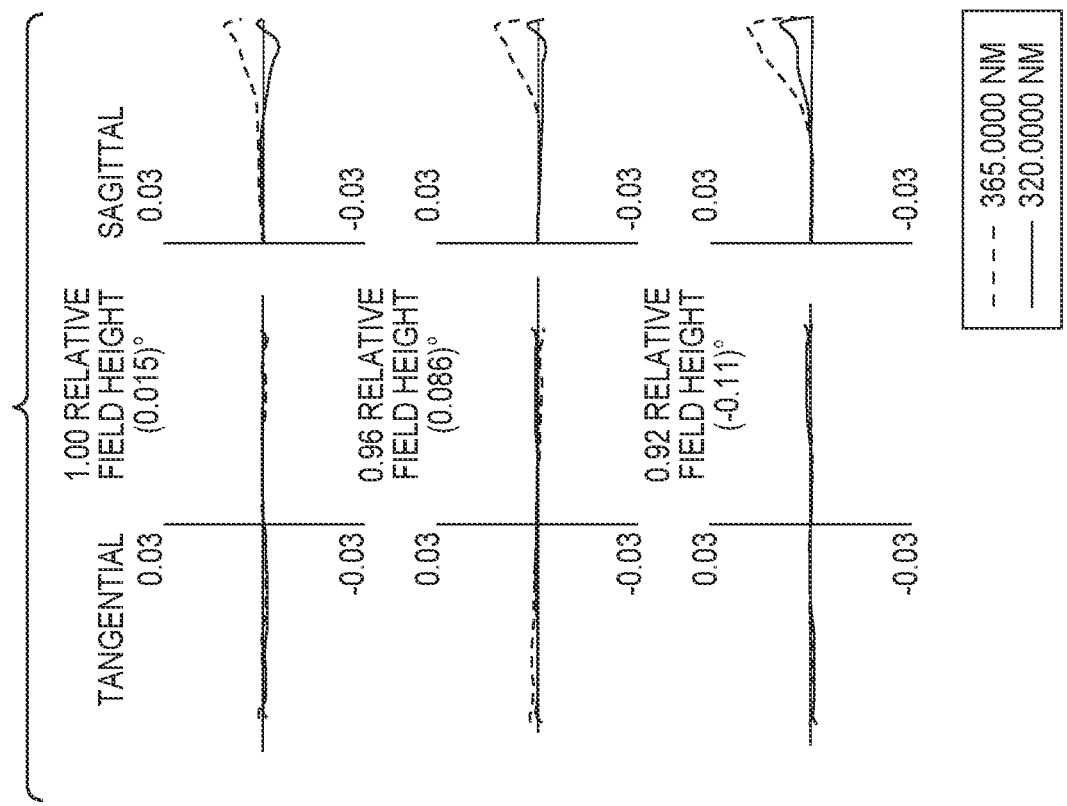
Figure 5B:
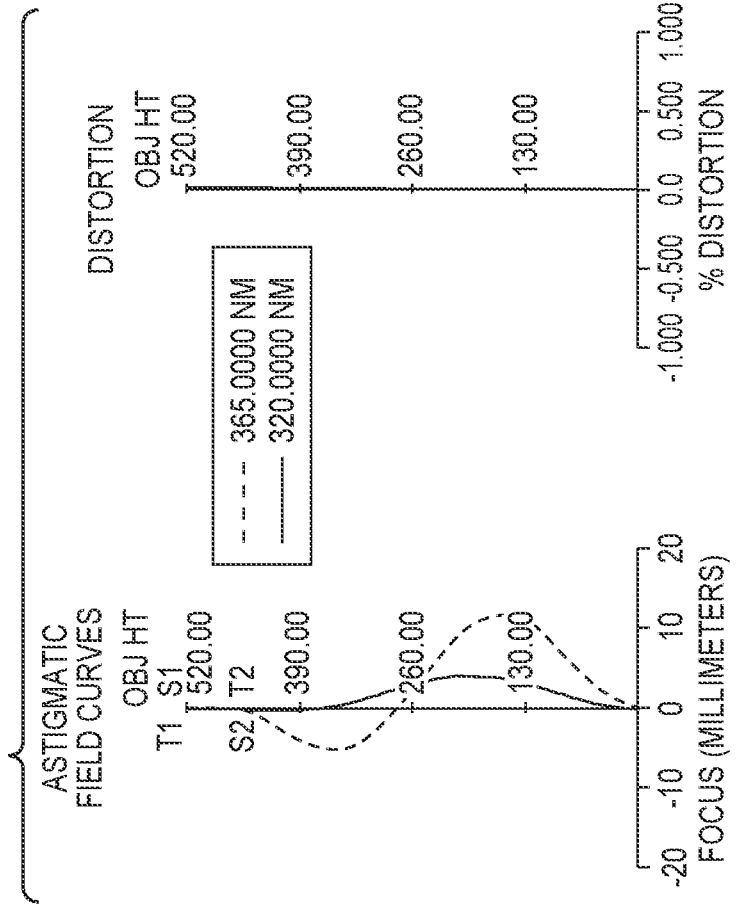

FIG. 5B is a view showing the longitudinal aberration and distortion of the projection optical system 10 of Example 5. FIG. 5C is a view showing the lateral aberration of the projection optical system 10 of Example 5.

Example 6

FIG. 6A is a sectional view showing the arrangement of a projection optical system 10 of Example 6. In Example 6, the projection optical system 10 is an equal-magnification system. The layout and image formation relationship of optical elements in the projection optical system 10 of Example 6 are the same as those of Example 1.

Table 6 below shows practical numerical value examples of the projection optical system 10 of Example 6. Note that the NA is 0.12 on the object plane side, the correction wavelength is i-line (365 nm), 320 nm, and the used image height is 480 to 520 mm. Accordingly, the exposure slit width is 40 mm. This used image height ensures a simultaneous exposure width of 750 mm or more. The projection optical system 10 of Example 6 includes a plurality of aspherical mirror surfaces and a plurality of aspherical lens surfaces.

TABLE 6

| Surface number | | R | D | N |
|---|---|---|---|---|
| Object | | 0 | 0 | |
| 1 | | 0 | 216.27 | |
| 2 | Aspherical | 2012.25 | 95 | 'SiO2' |
| 3 | | 0 | 600.12 | |
| 4 | | −1025.59 | 360.97 | |
| 5 | Aspherical | −1495.57 | −360.97 | Reflecting |
| 6 | Aspherical | −1025.59 | 360.97 | Reflecting |
| 7 | | −1495.57 | 50 | |
| 8 | | −4412.97 | 30 | 'SiO2' |
| 9 | | −4586.58 | 21 | |
| 10 | Aspherical | −1236.02 | −21 | Reflecting |
| 11 | | −4586.58 | −30 | 'SiO2' |
| 12 | | −4412.97 | −50 | |
| 13 | | 0 | −360.97 | |

TABLE 6-continued

| | | | | |
|---|---|---|---|---|
| 14 | Aspherical | −1025.59 | 360.97 | Reflecting |
| 15 | Aspherical | −1495.57 | −360.97 | Reflecting |
| 16 | | 0 | −600.12 | |
| 17 | | 0 | −95 | 'SiO2' |
| 18 | Aspherical | 2012.25 | −216.27 | |
| Image | | | | |

Aspherical surface data

| Surface number | K | A04 | B06 | C08 | D10 |
|---|---|---|---|---|---|
| 2 | 2.6980E+00 | 1.1640E−09 | −1.4360E−14 | 9.1670E−20 | −3.9330E−25 |
| 5 | −2.4740E−01 | 8.6820E−12 | −5.9800E−18 | 1.6730E−23 | −1.6060E−29 |
| 6 | −7.3730E−02 | 8.0690E−12 | −1.0890E−16 | 1.0640E−21 | −7.8670E−26 |
| 10 | −1.3500E−01 | −1.8960E−11 | 4.2930E−17 | −7.5310E−21 | 4.1440E−25 |
| 14 | −7.3730E−02 | 8.0690E−12 | −1.0890E−16 | 1.0640E−21 | −7.8670E−26 |
| 15 | −2.4740E−01 | 8.6820E−12 | −5.9800E−18 | 1.6730E−23 | −1.6060E−29 |
| 18 | 2.6980E+00 | 1.1640E−09 | −1.4360E−14 | 9.1670E−20 | −3.9330E−25 |

| Surface number | E12 | F14 | G16 | H18 | J20 |
|---|---|---|---|---|---|
| 2 | 1.1140E−30 | −1.8170E−36 | 8.8120E−43 | 1.8190E−48 | −2.2620E−54 |
| 5 | −1.3460E−34 | 8.6920E−41 | 3.5640E−46 | 1.4400E−51 | −3.9900E−57 |
| 6 | 1.6610E−30 | −1.9550E−35 | 1.2930E−40 | −3.9610E−46 | 1.6260E−52 |
| 10 | −1.3170E−29 | 2.6860E−34 | −4.3930E−39 | 6.1180E−44 | −4.4640E−49 |
| 14 | 1.6610E−30 | −1.9550E−35 | 1.2930E−40 | −3.9610E−46 | 1.6260E−52 |
| 15 | −1.3460E−34 | 8.6920E−41 | 3.5640E−46 | 1.4400E−51 | −3.9900E−57 |
| 18 | 1.1140E−30 | −1.8170E−36 | 8.8120E−43 | 1.8190E−48 | −2.2620E−54 |

The projection optical system 10 of Example 6 satisfies the following conditions:
As condition 1, pupil projection amount (Pt/Lt1)=0.07
As condition 2, working distance (W1/R2)=0.89
As condition 3, concentricity ((R2+D)/R1)=0.93
As condition 4, concentricity (R3/R1)=0.83
As condition 5, concentricity (R3/Lt1)=0.90
As condition 6, working distance (W1/Lt1)=0.66

FIG. 6B is a view showing the longitudinal aberration and distortion of the projection optical system 10 of Example 6. FIG. 6C is a view showing the lateral aberration of the projection optical system 10 of Example 6.

Example 7

FIG. 7A is a sectional view showing the arrangement of a projection optical system 10 of Example 7. In Example 7, the projection optical system 10 is an equal-magnification system. The layout and image formation relationship of optical elements in the projection optical system 10 of Example 7 are the same as those of Example 1.

Table 7 below shows practical numerical value examples of the projection optical system 10 of Example 7. Note that the NA is 0.13 on the object plane side, the correction wavelengths are i-line (365 nm), h-line (405 nm), and g-line (436 nm), and the used image height is 500 to 530 mm. Accordingly, the exposure slit width is 30 mm. This used image height ensures a simultaneous exposure width of 750 mm or more. The projection optical system 10 of Example 7 includes a plurality of aspherical mirror surfaces and a plurality of aspherical lens surfaces.

TABLE 7

| Surface number | | R | D | N |
|---|---|---|---|---|
| Object | | | 0 | |
| 1 | | | 18.21 | |
| 2 | | | 11.38 | 'SiO2' |
| 3 | | | 74.78 | |
| 4 | Aspherical | −8713.03 | 70 | 'SiO2' |
| 5 | | | 726.38 | |
| 6 | | −1178.26 | 591.59 | |
| 7 | | −1845.9 | −591.59 | Reflecting |
| 8 | Aspherical | −1178.26 | 0 | |
| 9 | | | 591.59 | |
| 10 | | −1845.9 | 50 | |
| 11 | | −2722.84 | 20.38 | 'SiO2' |
| 12 | | −2673 | 30.05 | |
| 13 | Aspherical | −1556.35 | −30.05 | Reflecting |
| 14 | | −2673 | −20.38 | 'SiO2' |
| 15 | | −2722.84 | −50 | |
| 16 | | | −591.59 | |
| 17 | Aspherical | −1178.26 | 0 | |
| 18 | | | 591.59 | |
| 19 | | −1845.9 | −591.59 | Reflecting |
| 20 | | | −726.38 | |
| 21 | Aspherical | −8713.03 | −70 | 'SiO2' |
| 22 | | | −74.78 | |

TABLE 7-continued

| | | | | | |
|---|---|---|---|---|---|
| 23 | | | | −11.38 | 'SiO2' |
| 24 | | | | −18.21 | |
| Image | | | | | |

| Aspherical surface data | | | | | |
|---|---|---|---|---|---|
| Surface number | K | A04 | B06 | C08 | D10 |
| 4 | 2.6980E+00 | 1.7010E−09 | −1.5430E−14 | 9.1050E−20 | −3.9170E−25 |
| 8 | −2.8980E−02 | −6.0400E−12 | −4.8000E−17 | 3.1090E−21 | −9.6560E−26 |
| 13 | −2.9690E−01 | −1.2230E−11 | 1.0250E−16 | −9.9840E−21 | 5.1480E−25 |
| 17 | −2.8980E−02 | −6.0400E−12 | −4.8000E−17 | 3.1090E−21 | −9.6560E−26 |
| 21 | 2.6980E+00 | 1.7010E−09 | −1.5430E−14 | 9.1050E−20 | −3.9170E−25 |
| Surface number | E12 | F14 | G16 | H18 | J20 |
| 4 | 1.1200E−30 | −1.8010E−36 | 8.5450E−43 | 1.7110E−48 | −2.1270E−54 |
| 8 | 1.7310E−30 | −1.8970E−35 | 1.2580E−40 | −4.6510E−46 | 7.3810E−52 |
| 13 | −1.5780E−29 | 2.9540E−34 | −3.3140E−39 | 2.0500E−44 | −5.3740E−50 |
| 17 | 1.7310E−30 | −1.8970E−35 | 1.2580E−40 | −4.6510E−46 | 7.3810E−52 |
| 21 | 1.1200E−30 | −1.8010E−36 | 8.5450E−43 | 1.7110E−48 | −2.1270E−54 |

The projection optical system 10 of Example 7 satisfies the following conditions:
As condition 1, pupil projection amount (Pt/Lt1)=0.06
As condition 2, working distance (W1/R2)=0.76
As condition 3, concentricity ((R2+D)/R1)=0.96
As condition 4, concentricity (R3/R1)=0.84
As condition 5, concentricity (R3/Lt1)=0.98
As condition 6, working distance (W1/Lt1)=0.57

FIG. 7B is a view showing the longitudinal aberration and distortion of the projection optical system 10 of Example 7. FIG. 7C is a view showing the lateral aberration of the projection optical system 10 of Example 7.

Example 8

Figure 8A:
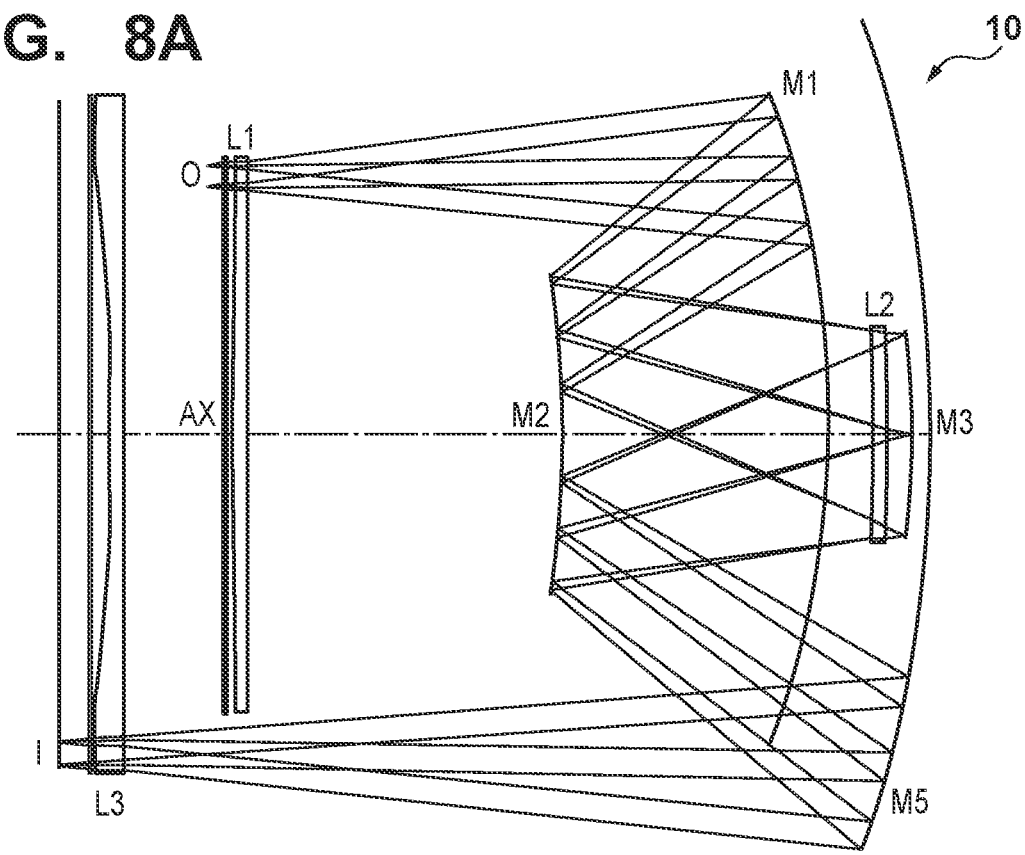
FIGS. 8A and 8B are views for explaining a projection optical system according to Example 8 of the present invention.

FIG. 8A is a sectional view showing the arrangement of a projection optical system 10 according to Example 8. In Example 8, the projection optical system 10 is an enlarging system having a magnification of ×1.25. The projection optical system 10 includes a first concave mirror M1 having positive power, a first convex mirror M2 having negative power, a second concave mirror M3 having positive power, and a third concave mirror M5 having positive power.

A lens L1 is placed near an object plane O, and a lens L3 is placed near an image plane I. A lens L2 is placed near the second concave mirror M3. Light from the object plane O forms an image on the image plane I through the lens L1, first concave mirror M1, first convex mirror M2, lens L2, second concave mirror M3, lens L2, first convex mirror M2, third concave mirror M5, and lens L3 in this order. The second concave mirror M3 is placed on the pupil plane of the projection optical system 10.

The only difference of the projection optical system 10 of Example 8 from an equal-magnification system is that the light reflected for the second time by the first convex mirror M2 propagates in the order of the third concave mirror M5 and lens L3. The rest of the arrangement is the same as that of the equal-magnification systems explained in Examples 1 to 7.

Table 8 below shows practical numerical value examples of the projection optical system 10 of Example 8. Note that the NA is 0.08 on the image plane side, the correction wavelengths are i-line (365 nm) and h-line (405 nm), and the used image height is 625 to 675 mm. Accordingly, the exposure slit width is 50 mm. This used image height ensures a simultaneous exposure width of 750 mm or more. The projection optical system 10 of Example 8 includes a plurality of aspherical mirror surfaces and a plurality of aspherical lens surfaces.

TABLE 8

| Surface number | | R | D | N |
|---|---|---|---|---|
| Object | | | 0 | |
| 1 | | | 49.23 | |
| 2 | | | 12 | 'SiO2' |
| 3 | | | 10 | |
| 4 | Aspherical | −11407.08 | 26 | 'SiO2' |
| 5 | | | 713.36 | |
| 6 | | −1319.74 | 580.82 | |
| 7 | Aspherical | −1886.04 | −580.82 | Reflecting |
| 8 | Aspherical | −1319.74 | 0 | Reflecting |
| 9 | | | 580.82 | |
| 10 | | −1886.04 | 104.25 | |
| 11 | | −10607.1 | 30.95 | 'SiO2' |
| 12 | Aspherical | −9732.89 | 18.26 | |
| 13 | | | 36.73 | |
| 14 | Aspherical | −1695.22 | −36.73 | Reflecting |
| 15 | | | −18.26 | |
| 16 | Aspherical | −9732.89 | −30.95 | 'SiO2' |
| 17 | | −10607.1 | −104.25 | |
| 18 | | | −580.82 | |
| 19 | Aspherical | −1319.74 | 0 | Reflecting |

TABLE 8-continued

| | | | | |
|---|---|---|---|---|
| 20 | | | 818.71 | |
| 21 | Aspherical | −2355.19 | −818.71 | Reflecting |
| 22 | | | −988.61 | |
| 23 | | | −33 | 'SiO2' |
| 24 | Aspherical | −10974.44 | −37 | |
| 25 | | | −12 | 'SiO2' |
| 26 | | | −50 | |
| Image | | | | |

Aspherical surface data

| Surface number | K | A04 | B06 | C08 | D10 |
|---|---|---|---|---|---|
| 4 | −4.0000E+00 | 1.5410E−09 | −1.4440E−14 | 7.5760E−20 | −2.9280E−25 |
| 7 | 8.5550E−02 | −1.8560E−12 | −3.5470E−18 | −2.4110E−24 | −1.9760E−31 |
| 8 | 1.0270E−01 | −4.5390E−11 | −3.6100E−17 | 2.1430E−21 | −7.2450E−26 |
| 12 | −4.0000E+00 | 4.3080E−11 | −1.5070E−15 | 1.1900E−20 | 4.6130E−26 |
| 14 | 1.3500E−01 | −2.2460E−11 | 5.4680E−16 | −1.7630E−21 | 1.0860E−25 |
| 16 | −4.0000E+00 | 4.3080E−11 | −1.5070E−15 | 1.1900E−20 | 4.6130E−26 |
| 19 | 1.0270E−01 | −4.5390E−11 | −3.6100E−17 | 2.1430E−21 | −7.2450E−26 |
| 21 | 3.4490E−02 | −3.3700E−13 | −8.8170E−19 | −2.9180E−25 | −3.7570E−32 |
| 24 | 4.0000E+00 | 6.4350E−10 | −1.2680E−14 | 7.7910E−20 | −2.9610E−25 |

| Surface number | E12 | F14 | G16 | H18 | J20 |
|---|---|---|---|---|---|
| 4 | 8.2480E−31 | −1.2660E−36 | 3.3490E−43 | 6.4650E−49 | 6.6930E−55 |
| 7 | 4.2490E−36 | 1.7180E−42 | 2.4770E−47 | −6.1340E−53 | 3.7940E−59 |
| 8 | 1.0440E−30 | −9.4510E−36 | 6.9920E−41 | −3.7520E−46 | 9.2880E−52 |
| 12 | −1.2500E−30 | 5.8520E−35 | 9.9850E−40 | −4.4960E−44 | 3.7550E−49 |
| 14 | −1.2350E−29 | 3.0640E−34 | −1.2650E−39 | −6.1100E−44 | 6.9940E−49 |
| 16 | −1.2500E−30 | 5.8520E−35 | 9.9850E−40 | −4.4960E−44 | 3.7550E−49 |
| 19 | 1.0440E−30 | −9.4510E−36 | 6.9920E−41 | −3.7520E−46 | 9.2880E−52 |
| 21 | 7.8300E−38 | −6.8540E−43 | 7.6250E−49 | 2.0630E−54 | −1.9900E−60 |
| 24 | 8.0780E−31 | −1.2760E−36 | 4.7630E−43 | 1.2620E−48 | −1.2050E−54 |

The projection optical system 10 of Example 8 satisfies the following conditions:
As condition 1, pupil projection amount (Pt/Lt1)=0.03
As condition 2, working distance (W1/R2)=0.85
As condition 3, concentricity ((R2+D)/R1)=0.91
As condition 4, concentricity (R3/R1)=0.72
As condition 5, concentricity (R3/Lt1)=0.90
As condition 6, working distance (W1/Lt1)=0.59
As condition 7, ratio ((R5/R1)/B)=1.00

Figure 8B:
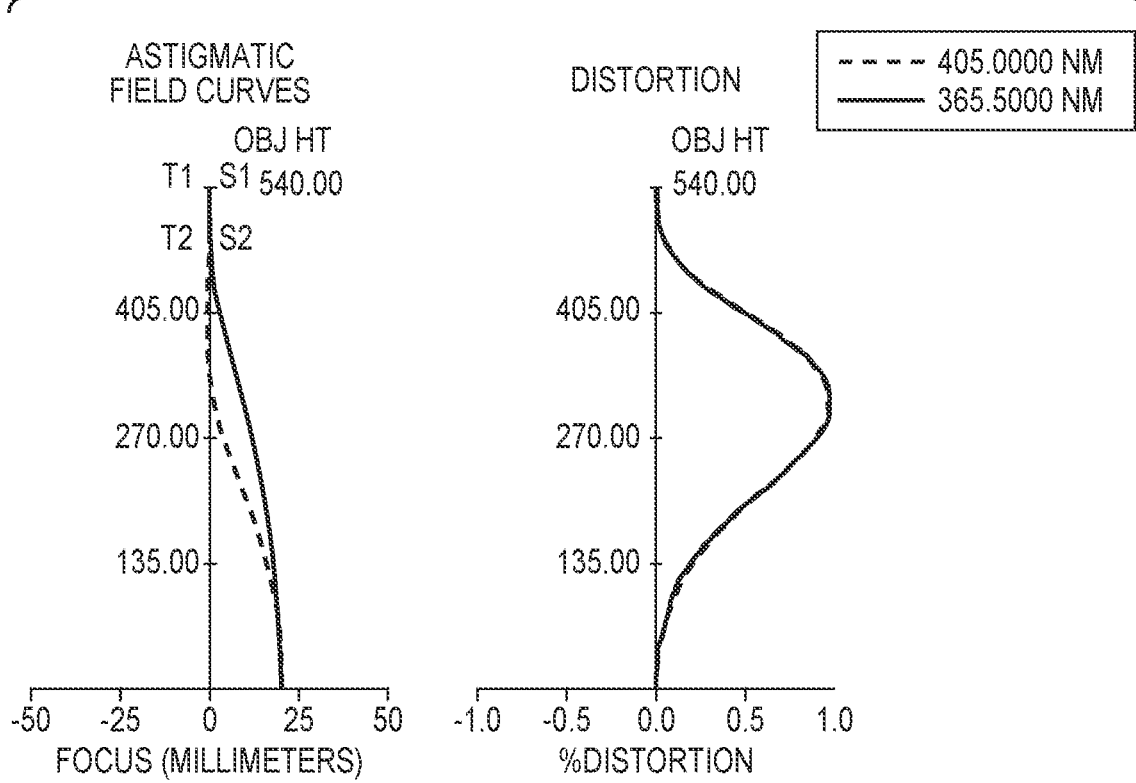

FIG. 8B is a view showing the longitudinal aberration and distortion of the projection optical system 10 of Example 8.

Example 9

Figure 9A:
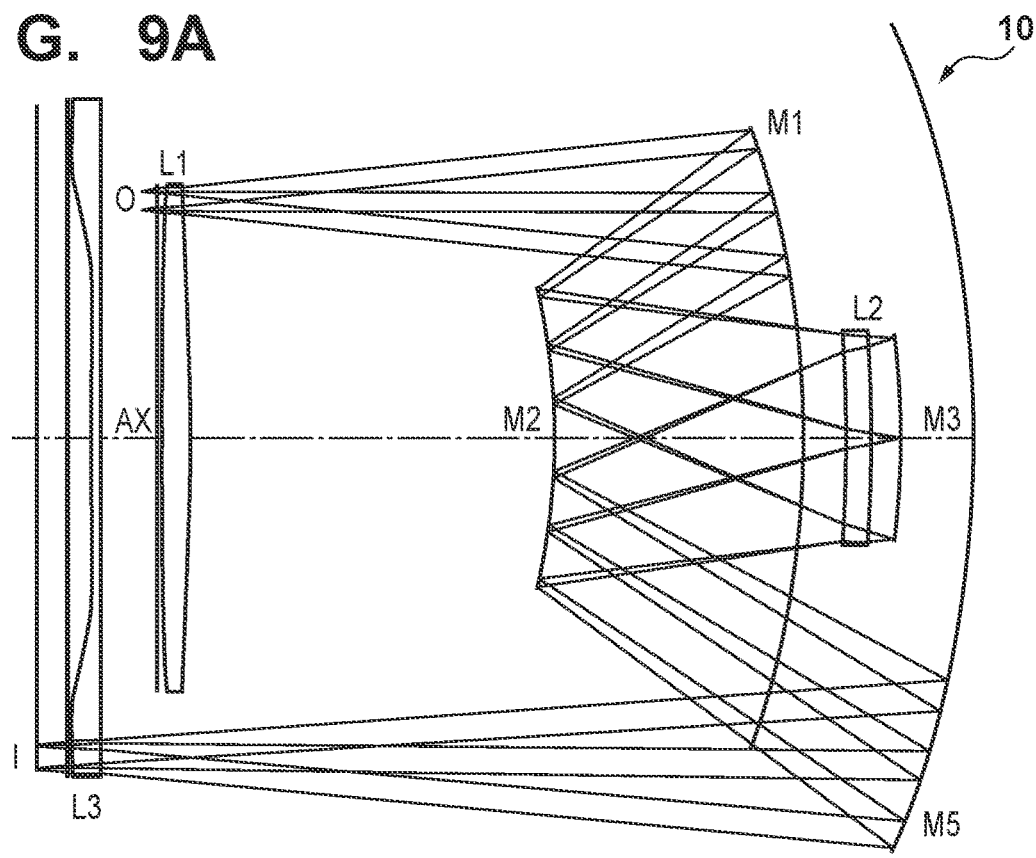
FIGS. 9A and 9B are views for explaining a projection optical system according to Example 9 of the present invention.

FIG. 9A is a sectional view showing the arrangement of a projection optical system 10 according to Example 9. In Example 9, the projection optical system 10 is an enlarging system having a magnification of ×1.38. The layout and image formation relationship of optical elements of the projection optical system 10 of Example 9 are the same as those of Example 8.

Table 9 below shows practical numerical value examples of the projection optical system 10 of Example 9. Note that the NA is 0.08 on the image plane side, the correction wavelengths are i-line (365 nm), h-line (405 nm), and g-line (436 nm), and the used image height is 690 to 745 mm. Accordingly, the exposure slit width is 55 mm. This used image height ensures a simultaneous exposure width of 750 mm or more. The projection optical system 10 of Example 9 includes a plurality of aspherical mirror surfaces and a plurality of aspherical lens surfaces.

TABLE 9

| Surface number | | R | D | N |
|---|---|---|---|---|
| Object | | | 0 | |
| 1 | | | 71.34 | |
| 2 | | | 6 | 'SiO2' |
| 3 | | | 10 | |
| 4 | Aspherical | −11967.88 | 65 | 'SiO2' |
| 5 | Aspherical | −3198.85 | 0 | |
| 6 | | | 775.73 | |
| 7 | | −1380.84 | 552.9 | |
| 8 | Aspherical | −1903.85 | −552.9 | Reflecting |
| 9 | Aspherical | −1380.84 | 0 | Reflecting |
| 10 | | | 552.9 | |
| 11 | | −1903.85 | 82.99 | |
| 12 | | −4552.16 | 56.18 | 'SiO2' |
| 13 | Aspherical | −4430.09 | 21.67 | |
| 14 | | | 41.42 | |
| 15 | Aspherical | −1711.97 | −41.42 | Reflecting |
| 16 | | | −21.67 | |
| 17 | Aspherical | −4430.09 | −56.18 | 'SiO2' |

TABLE 9-continued

| | | | | |
|---|---|---|---|---|
| 18 | | −4552.16 | −82.99 | |
| 19 | | | −552.9 | |
| 20 | Aspherical | −1380.84 | 0 | Reflecting |
| 21 | | | 913.79 | |
| 22 | Aspherical | −2632.22 | −913.79 | Reflecting |
| 23 | | | −977.95 | |
| 24 | | | −25 | 'SiO2' |
| 25 | Aspherical | 3089.51 | −50 | |
| 26 | | | −6 | 'SiO2' |
| 27 | | | −35 | |
| Image | | | | |

| Aspherical surface data | | | | | |
|---|---|---|---|---|---|
| Surface number | K | A04 | B06 | C08 | D10 |
| 4 | −3.2340E+00 | 1.3070E−09 | −1.3370E−14 | 7.6120E−20 | −2.8960E−25 |
| 5 | −4.0000E+00 | −7.8520E−11 | 2.4890E−15 | −1.1050E−22 | −1.1480E−26 |
| 8 | 1.9860E−01 | −8.0820E−12 | 5.0680E−18 | −1.8410E−23 | −2.4110E−29 |
| 9 | 5.1480E−01 | −6.4830E−11 | −5.4370E−16 | 5.5230E−21 | −6.4800E−26 |
| 13 | −4.0000E+00 | −3.7400E−11 | 1.2630E−15 | 5.6650E−21 | −3.8000E−25 |
| 15 | −2.9600E−01 | −9.6600E−12 | −8.3710E−16 | 1.1910E−20 | 1.1030E−25 |
| 17 | −4.0000E+00 | −3.7400E−11 | 1.2630E−15 | 5.6650E−21 | −3.8000E−25 |
| 20 | 5.1480E−01 | −6.4830E−11 | −5.4370E−16 | 5.5230E−21 | −6.4800E−26 |
| 22 | 1.4520E−01 | −2.6980E−12 | 1.7260E−18 | −2.3040E−24 | −2.9110E−30 |
| 25 | −4.0000E+00 | 7.2180E−10 | −1.6540E−14 | 7.8660E−20 | −2.8300E−25 |

| Surface number | E12 | F14 | G16 | H18 | J20 |
|---|---|---|---|---|---|
| 4 | 8.1610E−31 | −1.3350E−36 | 2.3380E−43 | 7.0880E−49 | 2.7200E−54 |
| 5 | −2.9390E−32 | 0.0000E+00 | 2.8580E−43 | 0.0000E+00 | 0.0000E+00 |
| 8 | 7.2340E−35 | 1.4580E−40 | −3.8970E−46 | −1.4980E−52 | 5.4670E−58 |
| 9 | 8.8180E−31 | −1.0080E−35 | 7.6580E−41 | −3.7520E−46 | 9.2880E−52 |
| 13 | −2.0100E−30 | 8.8570E−35 | 1.2040E−39 | −4.3550E−44 | 3.0110E−49 |
| 15 | −1.3850E−29 | 3.1700E−34 | −5.8670E−40 | −5.8880E−44 | 5.2640E−49 |
| 17 | −2.0100E−30 | 8.8570E−35 | 1.2040E−39 | −4.3550E−44 | 3.0110E−49 |
| 20 | 8.8180E−31 | −1.0080E−35 | 7.6580E−41 | −3.7520E−46 | 9.2880E−52 |
| 22 | 2.8120E−36 | 6.0900E−42 | −6.9170E−48 | −1.1500E−54 | 2.4050E−60 |
| 25 | 8.2210E−31 | −1.2820E−36 | 4.2160E−43 | 1.0650E−48 | −8.7450E−55 |

The projection optical system 10 of Example 9 satisfies the following conditions:

As condition 1, pupil projection amount (Pt/Lt1)=0.12, pupil projection amount (Pt/Lt2)=0.09
As condition 2, working distance (W1/R2)=0.67, working distance (W2/R2)=0.79
As condition 3, concentricity ((R2+D)/R1)=1.02, concentricity ((R2+D)/R5)=0.87
As condition 4, concentricity (R3/R1)=0.90, concentricity (R3/R5)=0.65
As condition 5, concentricity (R3/Lt1)=1.02, concentricity (R3/Lt2)=0.93
As condition 6, working distance (W1/Lt1)=0.55, working distance (W1/Lt2)=0.59
As condition 7, ratio ((R5/R1)/B)=1.00

Figure 9B:
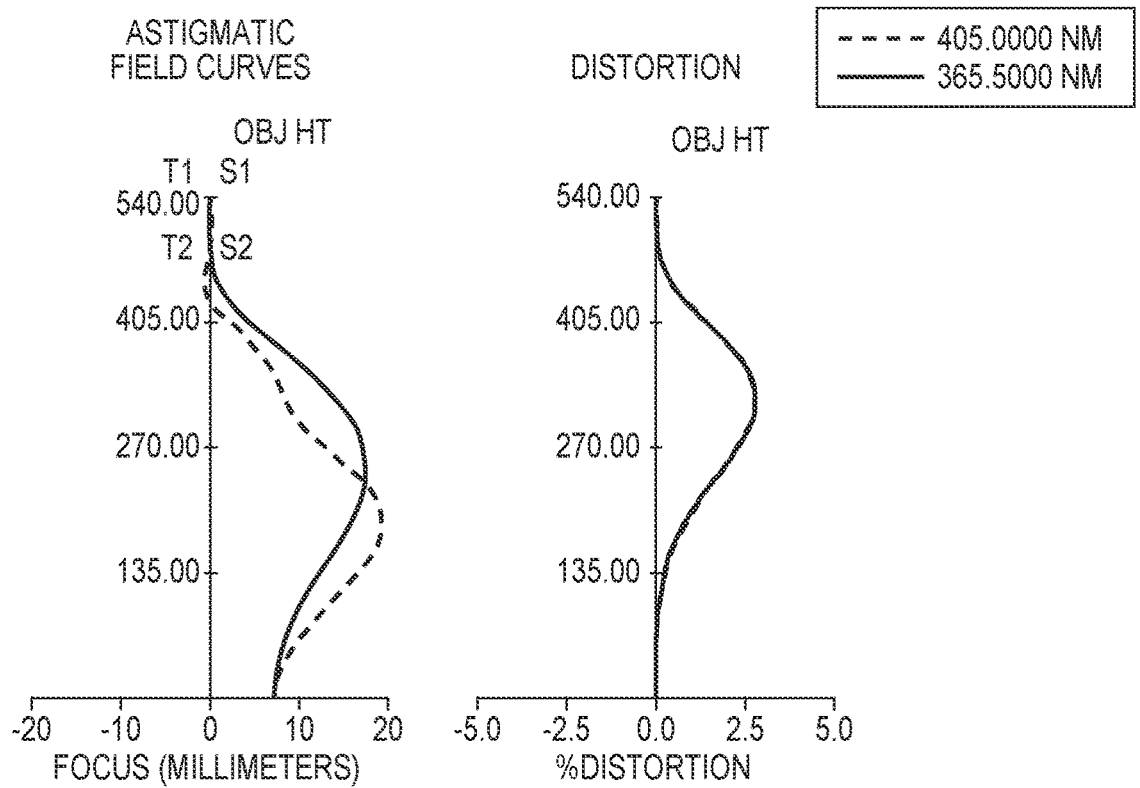

FIG. 9B is a view showing the longitudinal aberration and distortion of the projection optical system 10 of Example 9.

Example 10

Figure 10A:
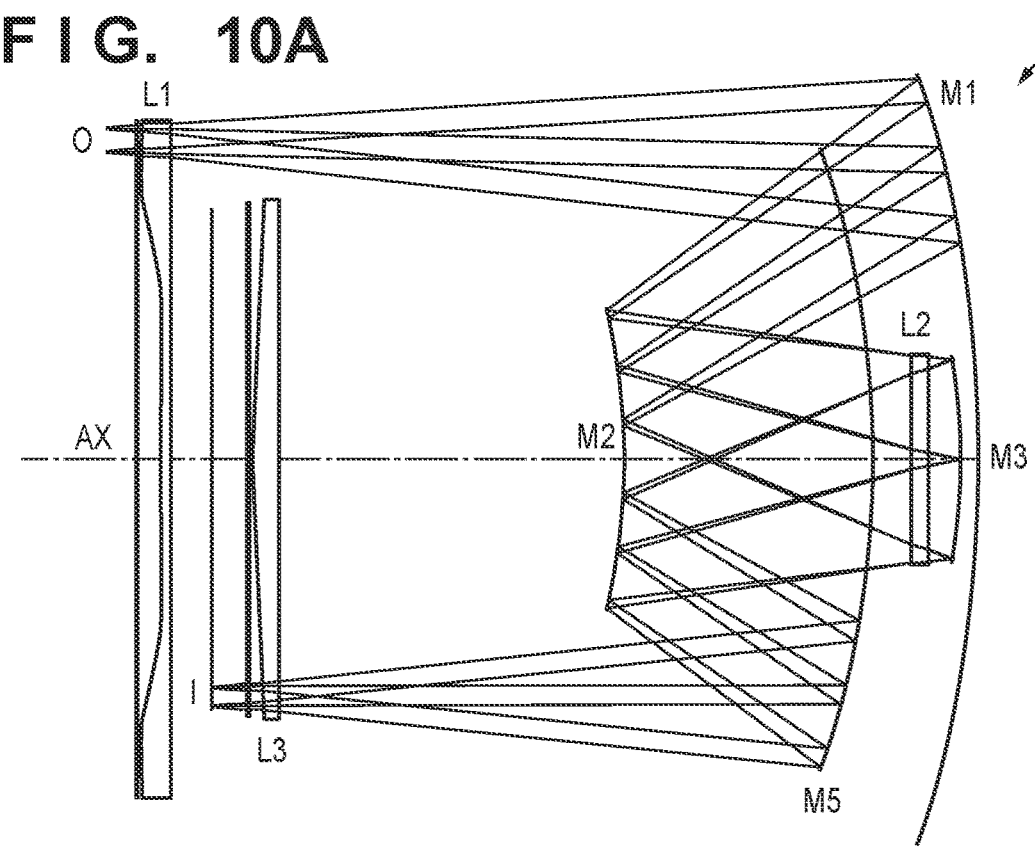
FIGS. 10A and 10B are views for explaining a projection optical system according to Example 10 of the present invention.

FIG. 10A is a sectional view showing the arrangement of a projection optical system 10 according to Example 10. In Example 10, the projection optical system 10 is a reducing system having a magnification of ×0.75. The layout and image formation relationship of optical elements of the projection optical system 10 of Example 10 are the same as those of Example 9.

Table 10 below shows practical numerical value examples of the projection optical system 10 of Example 10. Note that the NA is 0.107 on the image plane side, the correction wavelengths are i-line (365 nm) and h-line (405 nm), and the used image height is 500 to 540 mm. Accordingly, the exposure slit width is 40 mm. This used image height ensures a simultaneous exposure width of 750 mm or more. The projection optical system 10 of Example 10 includes a plurality of aspherical mirror surfaces and a plurality of aspherical lens surfaces.

TABLE 10

| Surface number | | R | D | N |
|---|---|---|---|---|
| Object | | | 0 | |
| 1 | | | 60 | |
| 2 | | | 6 | 'SiO2' |
| 3 | | | 50 | |
| 4 | Aspherical | 5939.49 | 25 | 'SiO2' |
| 5 | | | 1019.95 | |
| 6 | | | 798.19 | |
| 7 | Aspherical | −2488.24 | −798.19 | Reflecting |
| 8 | Aspherical | −1381.76 | 0 | Reflecting |
| 9 | | | 560.03 | |

TABLE 10-continued

| | | | | |
|---|---|---|---|---|
| 10 | | | 86.5 | |
| 11 | | −5570.45 | 39.2 | 'SiO2' |
| 12 | Aspherical | −5375.23 | 23.01 | |
| 13 | | | 42.79 | |
| 14 | Aspherical | −1714.43 | −42.79 | Reflecting |
| 15 | | | −23.01 | |
| 16 | Aspherical | −5375.23 | −39.2 | 'SiO2' |
| 17 | | −5570.45 | −86.5 | |
| 18 | | −1921.36 | −560.03 | |
| 19 | Aspherical | −1381.76 | 0 | Reflecting |
| 20 | | | 560.03 | |
| 21 | Aspherical | −1921.36 | −560.03 | Reflecting |
| 22 | | −1381.76 | −776.76 | |
| 23 | | | −57.73 | 'SiO2' |
| 24 | Aspherical | 3194.53 | −10 | |
| 25 | | | −6 | 'SiO2' |
| 26 Image | | | −75 | |

Aspherical surface data

| Surface number | K | A04 | B06 | C08 | D10 |
|---|---|---|---|---|---|
| 4 | −4.0000E+00 | 3.3390E−10 | −1.4150E−14 | 7.8220E−20 | −2.8800E−25 |
| 7 | −2.2980E−03 | 8.8210E−13 | −3.0540E−18 | −3.0540E−24 | −5.2630E−31 |
| 8 | 2.9020E−01 | −5.3870E−11 | −4.0670E−16 | 3.6810E−21 | −5.9140E−26 |
| 12 | −1.7510E+00 | 9.5200E−11 | −3.1310E−15 | 3.3260E−20 | −1.7760E−25 |
| 14 | 6.1670E−01 | −3.5610E−11 | 6.8570E−16 | 1.0860E−20 | −9.2910E−26 |
| 16 | −1.7510E+00 | 9.5200E−11 | −3.1310E−15 | 3.3260E−20 | −1.7760E−25 |
| 19 | 2.9020E−01 | −5.3870E−11 | −4.0670E−16 | 3.6810E−21 | −5.9140E−26 |
| 21 | 8.1300E−02 | −6.9940E−13 | −9.4420E−18 | −1.2790E−23 | 3.5690E−30 |
| 24 | −6.5180E−01 | 6.0450E−10 | −1.2190E−14 | 7.5850E−20 | −2.9680E−25 |

| Surface number | E12 | F14 | G16 | H18 | J20 |
|---|---|---|---|---|---|
| 4 | 8.1590E−31 | −1.2800E−36 | 4.4540E−43 | 1.0990E−48 | −9.4300E−55 |
| 7 | 5.3110E−36 | 6.7490E−42 | −9.9230E−48 | −5.6740E−54 | 8.4330E−60 |
| 8 | 8.5180E−31 | −8.5440E−36 | 6.9320E−41 | −3.7520E−46 | 9.2880E−52 |
| 12 | −2.6290E−30 | 1.0600E−34 | 1.5100E−39 | −5.7260E−44 | 4.1660E−49 |
| 14 | −1.4380E−29 | 3.4630E−34 | −5.0550E−40 | −6.7550E−44 | 5.9570E−49 |
| 16 | −2.6290E−30 | 1.0600E−34 | 1.5100E−39 | −5.7260E−44 | 4.1660E−49 |
| 19 | 8.5180E−31 | −8.5440E−36 | 6.9320E−41 | −3.7520E−46 | 9.2880E−52 |
| 21 | 6.7920E−35 | 4.5200E−41 | −3.8660E−46 | 3.5290E−52 | 3.7940E−59 |
| 24 | 8.1100E−31 | −1.2800E−36 | 4.4850E−43 | 1.0670E−48 | −4.4500E−55 |

The projection optical system 10 of Example 10 satisfies the following conditions:
As condition 1, pupil projection amount (Pt/Lt1)=0.02, pupil projection amount (Pt/Lt2)=0.11
As condition 2, working distance (W1/R2)=0.84, working distance (W2/R2)=0.67
As condition 3, concentricity ((R2+D)/R1)=0.88, concentricity ((R2+D)/R5)=1.01
As condition 4, concentricity (R3/R1)=0.69, concentricity (R3/R5)=0.89
As condition 5, concentricity (R3/Lt1)=0.90, concentricity (R3/Lt2)=1.02
As condition 6, working distance (W1/Lt1)=0.61, working distance (W1/Lt2)=0.55
As condition 7, ratio ((R5/R1)/B)=1.03

Figure 10B:
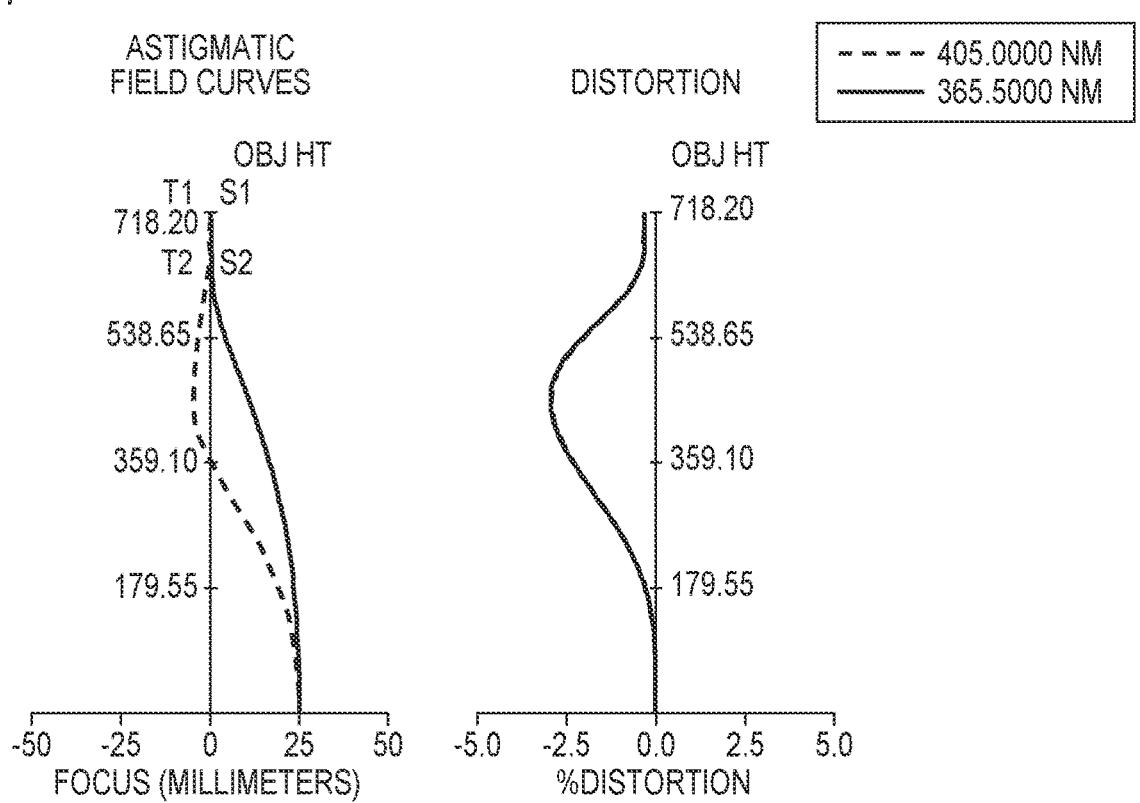

FIG. 10B is a view showing the longitudinal aberration and distortion of the projection optical system 10 of Example 10.

Example 11

Figure 11A:
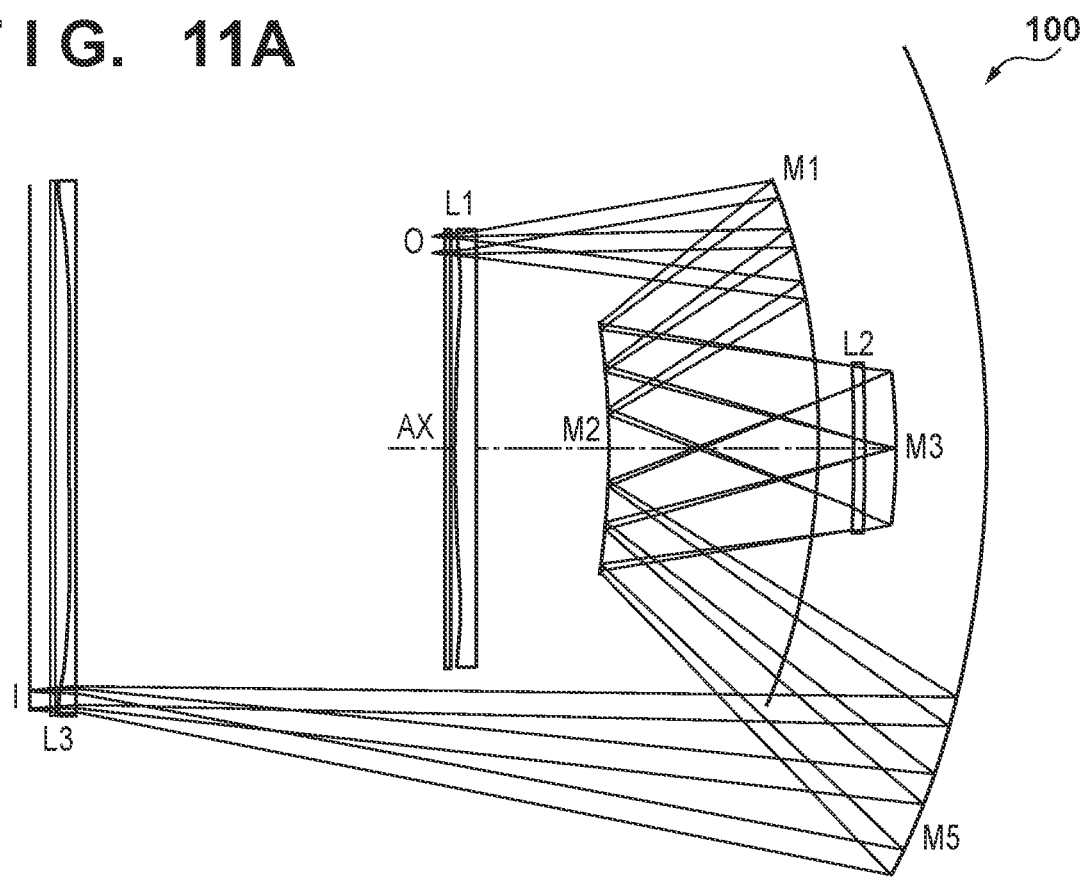
FIGS. 11A and 11B are views for explaining a projection optical system according to Example 11 of the present invention.

FIG. 11A is a sectional view showing the arrangement of a projection optical system 10 according to Example 11. In Example 11, the projection optical system 10 is an enlarging system having a magnification of ×1.25. The layout and image formation relationship of optical elements of the projection optical system 10 of Example 11 are the same as those of Example 8.

Table 11 below shows practical numerical value examples of the projection optical system 10 of Example 11. Note that the NA is 0.08 on the image plane side, the correction wavelengths are i-line (365 nm) and h-line (405 nm), and the used image height is 625 to 675 mm. Accordingly, the exposure slit width is 50 mm. This used image height ensures a simultaneous exposure width of 750 mm or more. The projection optical system 10 of Example 11 includes a plurality of aspherical mirror surfaces and a plurality of aspherical lens surfaces.

TABLE 11

| Surface number | R | D | N |
|---|---|---|---|
| Object | | | |
| 1 | | 0 | |
| 2 | | 49.48 | |
| 3 | | 12 | 'SiO2' |

TABLE 11-continued

| | | | | |
|---|---|---|---|---|
| 4 | | | 10 | |
| 5 | Aspherical | −16833.11 | 62.36 | 'SiO2' |
| 6 | | | 368.64 | |
| 7 | | −1230.07 | 582.4 | |
| 8 | Aspherical | −1712.56 | −582.4 | Reflecting |
| 9 | Aspherical | −1230.07 | 582.4 | Reflecting |
| 10 | | −1712.56 | 94.54 | |
| 11 | | −3296.43 | 25 | 'SiO2' |
| 12 | Aspherical | −3217.51 | 33.01 | |
| 13 | | | 51.48 | |
| 14 | Aspherical | −1735.02 | −51.48 | Reflecting |
| 15 | | | −33.01 | |
| 16 | Aspherical | −3217.51 | −25 | 'SiO2' |
| 17 | | −3296.43 | −94.54 | |
| 18 | | | −582.4 | |
| 19 | Aspherical | −1230.07 | 1041.04 | Reflecting |
| 20 | Aspherical | −2456.88 | −1041.04 | Reflecting |
| 21 | | | −1480.62 | |
| 22 | | | −25 | 'SiO2' |
| 23 | Aspherical | −39858.98 | −37 | |
| 24 | | | −12 | 'SiO2' |
| 25 Image | | | −50 | |

| Aspherical surface data | | | | |
|---|---|---|---|---|
| Surface number | K | A04 | B06 | C08 | D10 |
| 5 | −2.3570E−01 | 3.2960E−09 | −2.4370E−14 | 7.3460E−20 | −2.4980E−25 |
| 8 | 8.2130E−02 | −2.6860E−13 | −9.3550E−18 | 3.0540E−24 | 9.2580E−30 |
| 9 | −2.8760E−01 | −2.0460E−11 | 3.1380E−16 | 2.2840E−21 | −1.0000E−25 |
| 12 | 2.1570E+00 | 1.8130E−10 | −4.8920E−15 | 2.6050E−20 | 6.6920E−25 |
| 14 | 9.0470E−01 | −4.2860E−11 | 1.7630E−16 | −1.5070E−20 | 2.8940E−25 |
| 16 | 2.1570E+00 | 1.8130E−10 | −4.8920E−15 | 2.6050E−20 | 6.6920E−25 |
| 19 | −2.8760E−01 | −2.0460E−11 | 3.1380E−16 | 2.2840E−21 | −1.0000E−25 |
| 20 | −2.2670E−02 | 7.5060E−13 | −5.4710E−19 | 1.3740E−25 | 4.9740E−31 |
| 23 | 4.0000E+00 | 1.8220E−09 | −1.6730E−14 | 7.6450E−20 | −2.8920E−25 |

| Surface number | E12 | F14 | G16 | H18 | J20 |
|---|---|---|---|---|---|
| 5 | 9.3210E−31 | −1.2930E−36 | −5.0470E−43 | −1.3520E−48 | 6.7810E−54 |
| 8 | 4.6410E−36 | −2.7880E−41 | −4.8970E−47 | 6.5210E−53 | 3.7940E−59 |
| 9 | 9.0230E−31 | −5.4870E−36 | 5.3980E−41 | −3.7520E−46 | 9.2880E−52 |
| 12 | −1.0280E−29 | −3.2360E−34 | 1.6080E−39 | 2.1340E−43 | −2.7180E−48 |
| 14 | −1.0490E−29 | 2.5350E−34 | −1.9300E−39 | −2.8880E−44 | 4.7150E−49 |
| 16 | −1.0280E−29 | −3.2360E−34 | 1.6080E−39 | 2.1340E−43 | −2.7180E−48 |
| 19 | 9.0230E−31 | −5.4870E−36 | 5.3980E−41 | −3.7520E−46 | 9.2880E−52 |
| 20 | 4.3850E−37 | −1.0360E−42 | −3.5760E−49 | 1.0490E−54 | −3.7890E−61 |
| 23 | 8.2350E−31 | −1.2710E−36 | 4.3120E−43 | 1.1460E−48 | −1.0170E−54 |

The projection optical system 10 of Example 11 satisfies the following conditions:
As condition 1, pupil projection amount (Pt/Lt1)=0.16, pupil projection amount (Pt/Lt2)=0.11
As condition 2, working distance (W1/R2)=0.41, working distance (W2/R2)=1.30
As condition 3, concentricity ((R2+D)/R1)=1.06, concentricity ((R2+D)/R5)=0.92
As condition 4, concentricity (R3/R1)=1.01, concentricity (R3/R5)=0.71
As condition 5, concentricity (R3/Lt1)=1.35, concentricity (R3/Lt2)=0.73
As condition 6, working distance (W1/Lt1)=0.39, working distance (W1/Lt2)=0.67
As condition 7, ratio ((R5/R1)/B)=1.15

Figure 11B:
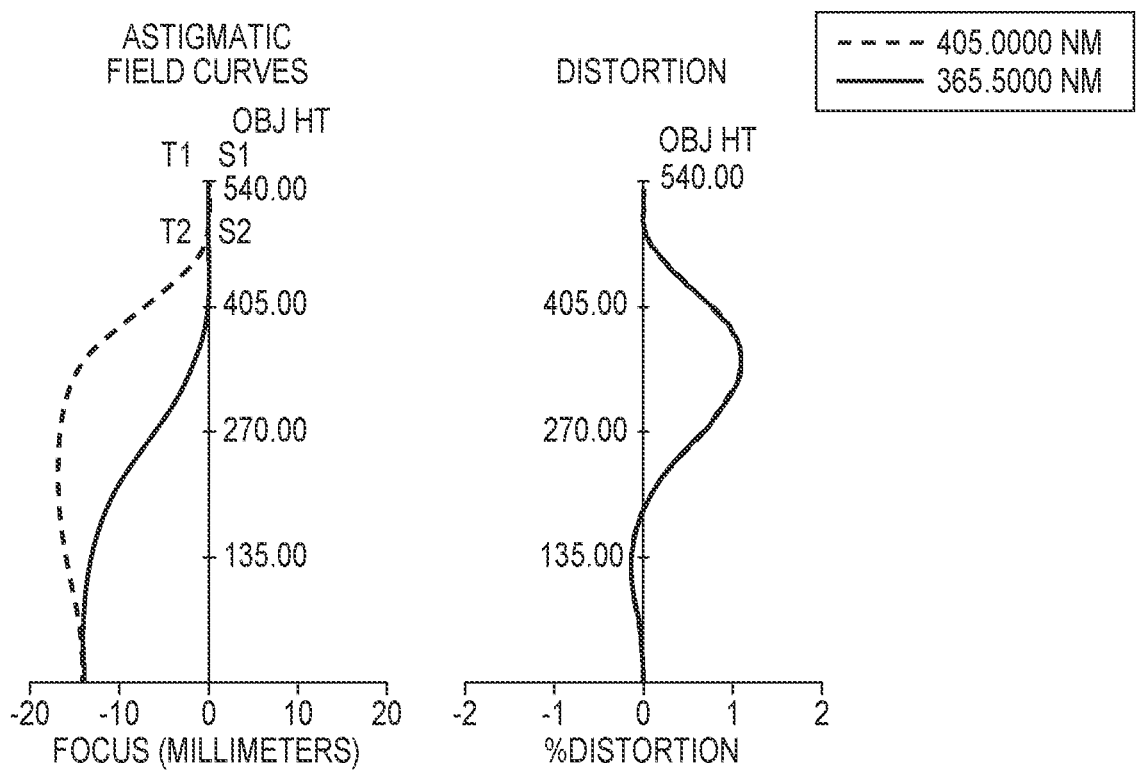

FIG. 11B is a view showing the longitudinal aberration and distortion of the projection optical system 10 of Example 11.

In Example 11, condition 7 is 1.15. However, there is a principle that the ratio R5/R1 ideally determines the magnification of an enlarging system or reducing system. From this point of view, an equivalent allowable range within which the value of (R5/R1)/B is 1.0 or less exists. Therefore, (R5/R1)/B=1/1.15=0.87 is set as a lower limit.

Tables 12 and 13 collectively show the numerical values and conditions of the projection optical systems 10 of Examples 1 to 11.

TABLE 12

| | | NA (@Image plane) | Correction wavelength | Ymax (@Image plane) | Ymin (@Image plane) | SW (@Image plane) |
|---|---|---|---|---|---|---|
| Example 1 | Equal-magnification system 1 | 0.12 | ihg-lines | 530 | 490 | 40 |

TABLE 12-continued

|  |  | NA (@Image plane) | Correction wavelength | Ymax (@Image plane) | Ymin (@Image plane) | SW (@Image plane) |
|---|---|---|---|---|---|---|
| Example 2 | Equal-magnification system 2 | 0.12 | i-lines, 320 nm | 520 | 480 | 40 |
| Example 3 | Equal-magnification system 3 | 0.12 | i-lines, 320 nm | 520 | 480 | 40 |
| Example 4 | Equal-magnification system 4 | 0.12 | i-lines, 320 nm | 520 | 480 | 40 |
| Example 5 | Equal-magnification system 5 | 0.08 | i-lines, 320 nm | 520 | 480 | 40 |
| Example 6 | Equal-magnification system 6 | 0.12 | i-lines, 320 nm | 520 | 480 | 40 |
| Example 7 | Equal-magnification system 7 | 0.13 | ihg-lines | 530 | 500 | 30 |
| Example 8 | Enlarging system 1 | 0.08 | ih-lines | 675 | 625 | 50 |
| Example 9 | Enlarging system 2 | 0.08 | ih-lines | 745 | 690 | 55 |
| Example 10 | Reducing system 1 | 0.107 | ih-lines | 540 | 500 | 40 |
| Example 11 | Enlarging system 3 | 0.08 | ih-lines | 675 | 625 | 50 |

(Unit: mm)

TABLE 13

|  |  |  | Condition 1 Pupil projection amount (Pt/L1) | Condition 2 Working distance (w/R2) | Condition 3 Concentricity ((R2 + D)/R1) | Condition 4 Concentricity (R3/R1) | Condition 5 Concentricity (R3/L1) | Condition 6 Working distance (W/L1) | Condition 7 Ratio ((R5/R1)/ magnification) |
|---|---|---|---|---|---|---|---|---|---|
| Example 1 | Equal-magnification system 1 |  | 0.11 | 0.80 | 0.97 | 0.91 | 0.98 | 0.56 |  |
| Example 2 | Equal-magnification system 2 |  | 0.20 | 0.90 | 0.99 | 1.13 | 0.99 | 0.55 |  |
| Example 3 | Equal-magnification system 3 |  | 0.05 | 0.90 | 0.98 | 0.93 | 0.97 | 0.62 |  |
| Example 4 | Equal-magnification system 4 |  | 0.14 | 0.84 | 0.87 | 0.80 | 0.89 | 0.57 |  |
| Example 5 | Equal-magnification system 5 |  | 0.07 | 0.76 | 0.96 | 0.86 | 0.98 | 0.56 |  |
| Example 6 | Equal-magnification system 6 |  | 0.07 | 0.89 | 0.93 | 0.83 | 0.90 | 0.66 |  |
| Example 7 | Equal-magnification system 7 |  | 0.06 | 0.76 | 0.96 | 0.84 | 0.98 | 0.57 |  |
| Example 8 | Enlarging system 1 | Upper optical path | 0.12 | 0.61 | 1.01 | 0.90 | 1.07 | 0.51 | 1.00 |
|  | 1.25x | Lower optical path | 0.03 | 0.85 | 0.91 | 0.72 | 0.90 | 0.59 |  |
| Example 9 | Enlarging system 2 | Upper optical path | 0.12 | 0.67 | 1.02 | 0.90 | 1.02 | 0.55 | 1.00 |
|  | 1.38x | Lower optical path | 0.09 | 0.79 | 0.87 | 0.65 | 0.93 | 0.59 |  |
| Example 10 | Reducing system 1 | Upper optical path | 0.02 | 0.84 | 0.88 | 0.69 | 0.90 | 0.61 | 1.03 |
|  | 0.75x | Lower optical path | 0.11 | 0.67 | 1.01 | 0.89 | 1.02 | 0.55 |  |
| Example 11 | Enlarging system 3 | Upper optical path | 0.16 | 0.41 | 1.06 | 1.01 | 1.35 | 0.39 | 1.15 |

TABLE 13-continued

| | | | Condition 1 Pupil projection amount (Pt/L1) | Condition 2 Working distance (w/R2) | Condition 3 Concentricity ((R2 + D)/R1) | Condition 4 Concentricity (R3/R1) | Condition 5 Concentricity (R3/L1) | Condition 6 Working distance (W/L1) | Condition 7 Ratio ((R5/R1)/ magnification) |
|---|---|---|---|---|---|---|---|---|---|
| | 1.25x | Lower optical path | 0.11 | 1.30 | 0.92 | 0.71 | 0.73 | 0.67 | |
| Example 12 | | Equal-magnification system 1 (actual layout drawing) | 0.11 | 0.80 | 0.97 | 0.91 | 0.98 | 0.56 | |

Figure 15:
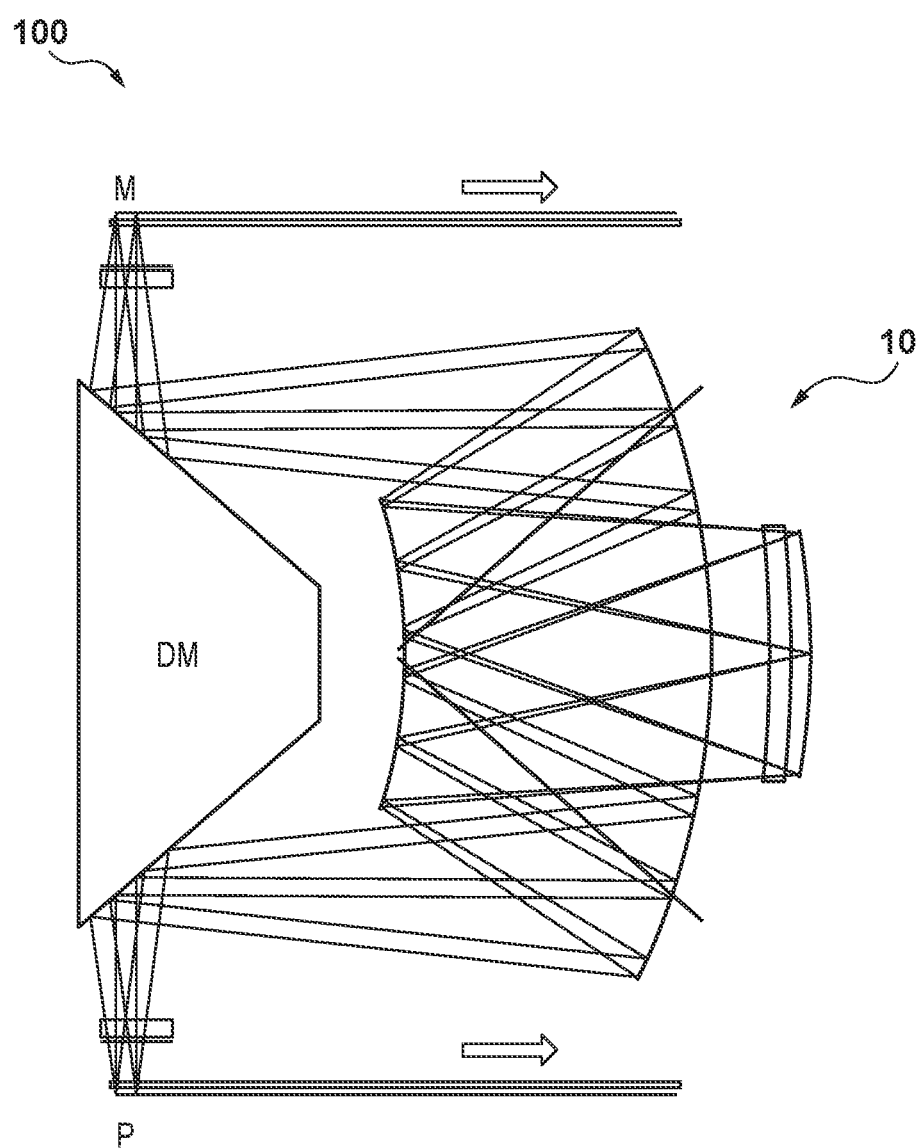
FIG. 15 is a view showing the arrangement of an exposure apparatus according to an aspect of the present invention.

The projection optical system according to this embodiment (the projection optical system 10 of each example) is applicable as, for example, a projection optical system for projecting an image of a mask pattern onto a substrate, to an exposure apparatus for exposing the substrate. FIG. 15 is a view showing the arrangement of an exposure apparatus 100 including the projection optical system 10.

A mask M is an original on which a pattern is formed. A substrate P is a plate coated with a photosensitive resist. The mask M and substrate P are held on movable stages and synchronously scanned in the direction of arrows. Consequently, the pattern of the mask M is transferred onto the substrate P. FIG. 15 does not show an illumination optical system for illuminating the mask M with light from a light source, and other units. The design example of Example 1 is applied to the projection optical system 10.

A trapezoidal bending mirror DM is positioned between the mask M and the substrate P. The bending mirror DM forms the first and second bending mirrors described earlier. Light from the mask M is reflected from above from the vertical direction to the horizontal direction by the upper reflecting surface of the bending mirror DM, and reflected downward from the horizontal direction to the vertical direction by the lower reflecting surface of the bending mirror DM. Since condition 2 or 6 of the working distance is satisfied as described above, the bending mirror DM can be installed while the optical system is downsized.

A method of manufacturing an article according to an embodiment of the present invention is suitable for manufacturing an article such as a device (for example, a semiconductor device, magnetic storage medium, or liquid crystal display device). This method of manufacturing includes a step of exposing a substrate coated with a photosensitizing agent by using an exposure apparatus 100 and a step of developing the exposed substrate. The method of manufacturing further includes other known steps (oxidation, deposition, vapor deposition, doping, planarization, etching, resist removal, dicing, bonding, packaging, and the like). The method of manufacturing the article according to this embodiment is superior to the conventional method in at least one of the performance of an article, quality, productivity, and production cost.

Note that the NA, image height, slit width, used wavelengths, and the like are not limited to numerical values exemplified in the examples and are changed in accordance with, for example, the necessary accuracy and specifications of the exposure apparatus, and the present invention includes these conditions. Note also that the layout of aspherical surfaces and their deviation amounts from a spherical surface are not limited to the examples. Furthermore, the projection optical systems of the above-described embodiment and examples are also applicable to each multi-lens optical system disclosed in Japanese Patent Laid-Open No. 7-57986.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2016-203033 filed on Oct. 14, 2016, which is hereby incorporated by reference herein in its entirety.

What is claimed is:

1. A projection optical system comprising a first concave reflecting surface, a first convex reflecting surface, a second concave reflecting surface, and a third concave reflecting surface,
    wherein the first concave reflecting surface, the first convex reflecting surface, the second concave reflecting surface, and the third concave reflecting surface are arranged such that light from an object plane forms an image on an image plane by being reflected by the first concave reflecting surface, the first convex reflecting surface, the second concave reflecting surface, the first convex reflecting surface, and the third concave reflecting surface in an order named, and
    wherein the first concave reflecting surface and the third concave reflecting surface are formed by one reflecting surface having one curvature radius, and the second concave reflecting surface is a reflecting surface different from the first concave reflecting surface and the third concave reflecting surface.

2. The system according to claim 1, further comprising a concave mirror including the first concave reflecting surface and the third concave reflecting surface, and which a hollow portion is provided in a central region,
    wherein a second concave mirror including the second concave reflecting surface is arranged in the hollow portion.

3. The system according to claim 1, wherein letting R2 be a curvature radius of the first convex reflecting surface, W1 be a distance between the first convex reflecting surface and the object plane with no reflecting surface existing, and W2 be a distance between the first convex reflecting surface and the image plane with no reflecting surface existing, $$0.70 \leq W1/R2 \leq 1.0 \text{ or } 0.70 \leq W2/R2 \leq 1.0$$

is satisfied.

4. The system according to claim 1, wherein letting R1 be a curvature radius of the first concave reflecting surface, R2 be a curvature radius of the first convex reflecting surface, R5 be a curvature radius of the third concave reflecting surface, D1 be a distance between the first concave reflecting surface and the first convex reflecting surface, and D2 be a distance between the first convex reflecting surface and the third concave reflecting surface, $$0.87 \leq (R2+D1)/R1 \leq 1.15 \text{ or } 0.87 \leq (R2+D2)/R5 \leq 1.15$$

is satisfied.

5. The system according to claim 1, wherein letting R1 be a curvature radius of the first concave reflecting surface, R3 be a curvature radius of the second concave reflecting surface, and R5 be a curvature radius of the third concave reflecting surface, $$0.8 \leq R3/R1 \leq 1.25 \text{ or } 0.8 \leq R3/R5 \leq 1.25$$

is satisfied.

6. The system according to claim 1, wherein letting R3 be a curvature radius of the second concave reflecting surface, Lt1 be a distance between the object plane and the second concave reflecting surface, and Lt2 be a distance between the second concave reflecting surface and the image plane, with no reflecting surface existing between the object plane and the first concave reflecting surface, and between the third concave reflecting surface and the image plane, $$0.9 \leq R3/Lt1 \leq 1.1 \text{ or } 0.9 \leq R3/Lt2 \leq 1.1$$

is satisfied.

7. The system according to claim 1, wherein letting W1 be a distance between the first convex reflecting surface and the object plane with no reflecting surface existing, W2 be a distance between the first convex reflecting surface and the image plane with no reflecting surface existing, Lt1 be a distance between the object plane and the second concave reflecting surface, and Lt2 be a distance between the second concave reflecting surface and the image plane, with no reflecting surface existing between the object plane and the first concave reflecting surface, and between the third concave reflecting surface and the image plane, $$0.5 \leq W1/Lt1 \leq 0.7 \text{ or } 0.5 \leq W2/Lt2 \leq 0.7$$

is satisfied.

8. The system according to claim 1, further comprising a lens having an aspherical shape between the object plane, the image plane, and the first convex reflecting surface.

9. The system according to claim 1, further comprising a meniscus lens having a first surface and a second surface curved in the same direction, between the first convex reflecting surface and the second concave reflecting surface.

10. The system according to claim 1, wherein at least one of the first concave reflecting surface, the first convex reflecting surface, the second concave reflecting surface, and the third concave reflecting surface has an aspherical shape.

11. The system according to claim 1, further comprising an aperture stop between the first convex reflecting surface and the second concave reflecting surface.

12. The system according to claim 11, wherein an aperture shape of the aperture stop is variable.

13. The system according to claim 1, wherein the projection optical system is one of an enlarging system and a reducing system.

14. The system according to claim 13, wherein letting R1 be a curvature radius of the first concave reflecting surface, R5 be a curvature radius of the third concave reflecting surface, and B be an image formation magnification of the projection optical system, $$B \times 0.87 \leq (R5/R1) \leq B \times 1.15$$

is satisfied.

15. The system according to claim 1, wherein the projection optical system is telecentric on the object plane side and the image plane side.

16. An exposure apparatus comprising:
an illumination optical system configured to illuminate a mask with light from a light source; and
a projection optical system configured to project an image of a pattern of the mask onto a substrate,
wherein the projection optical system comprises a first concave reflecting surface, a first convex reflecting surface, a second concave reflecting surface, and a third concave reflecting surface,
the first concave reflecting surface, the first convex reflecting surface, the second concave reflecting surface, and the third concave reflecting surface are arranged such that light from an object plane forms an image on an image plane by being reflected by the first concave reflecting surface, the first convex reflecting surface, the second concave reflecting surface, the first convex reflecting surface, and the third concave reflecting surface in an order named, and
wherein the first concave reflecting surface and the third concave reflecting surface are formed by one reflecting surface having one curvature radius, and the second concave reflecting surface is a reflecting surface different from the first concave reflecting surface and the third concave reflecting surface.

17. A method of manufacturing an article, the method comprising:
forming a pattern on a substrate using an exposure apparatus; and
developing the exposed substrate to manufacture the article,
wherein the exposure apparatus comprises:
an illumination optical system configured to illuminate a mask with light from a light source; and
a projection optical system configured to project an image of a pattern of the mask onto the substrate,
wherein the projection optical system comprises a first concave reflecting surface, a first convex reflecting surface, a second concave reflecting surface, and a third concave reflecting surface,
the first concave reflecting surface, the first convex reflecting surface, the second concave reflecting surface, and the third concave reflecting surface are arranged such that light from an object plane forms an image on an image plane by being reflected by the first concave reflecting surface, the first convex reflecting surface, the second concave reflecting surface, the first convex reflecting surface, and the third concave reflecting surface in an order named, and
wherein the first concave reflecting surface and the third concave reflecting surface are formed by one reflecting surface having one curvature radius, and the second concave reflecting surface is a reflecting surface different from the first concave reflecting surface and the third concave reflecting surface.

18. A projection optical system in which each reflecting surface is arranged such that light from an object plane forms an image on an image plane by being reflected by a first reflecting surface, a second reflecting surface, a third reflecting surface, a fourth reflecting surface, and a fifth reflecting surface in an order named,
wherein the first reflecting surface and the fifth reflecting surface are formed by one concave reflecting surface and the third reflecting surface is a reflecting surface different from the first reflecting surface and the fifth reflecting surface.

19. The system according to claim 18, wherein the concave reflecting surface forming the first reflecting surface and the fifth reflecting surface includes one curvature radius.

20. The system according to claim 18, wherein the first reflecting surface, the third reflecting surface and the fifth reflecting surface are concave reflecting surfaces, and the second reflecting surface and the fourth reflecting surface are convex reflecting surfaces.

21. The system according to claim 18, wherein letting R1 be a curvature radius of the first reflecting surface, R3 be a curvature radius of the third reflecting surface, and R5 be a curvature radius of the fifth reflecting surface, $$0.8 \leq R3/R1 \leq 1.25 \text{ or } 0.8 \leq R3/R5 \leq 1.25$$

is satisfied.

22. An exposure apparatus comprising:
an illumination optical system configured to illuminate a mask with light from a light source; and
a projection optical system configured to project an image of a pattern of the mask onto a substrate,
wherein the projection optical system includes each reflecting surface is arranged such that light from an object plane forms an image on an image plane by being reflected by a first reflecting surface, a second reflecting surface, a third reflecting surface, a fourth reflecting surface, and a fifth reflecting surface in an order named, and
wherein the first reflecting surface and the fifth reflecting surface are formed by one concave reflecting surface and the third reflecting surface is a reflecting surface different from the first reflecting surface and the fifth reflecting surface.

23. A method of manufacturing an article, the method comprising:
forming a pattern on a substrate using an exposure apparatus; and
developing the exposed substrate to manufacture the article,
wherein the exposure apparatus comprises:
an illumination optical system configured to illuminate a mask with light from a light source; and
a projection optical system configured to project an image of a pattern of the mask onto the substrate,
wherein the projection optical system includes each reflecting surface is arranged such that light from an object plane forms an image on an image plane by being reflected by a first reflecting surface, a second reflecting surface, a third reflecting surface, a fourth reflecting surface, and a fifth reflecting surface in an order named, and
wherein the first reflecting surface and the fifth reflecting surface are formed by one concave reflecting surface and the third reflecting surface is a reflecting surface different from the first reflecting surface and the fifth reflecting surface.

24. A projection optical system in which each reflecting surface is arranged such that light from an object plane forms an image on an image plane by being reflected by a first reflecting surface, a second reflecting surface, a third reflecting surface, a fourth reflecting surface, and a fifth reflecting surface in an order named,
wherein letting Lt1 be a distance between the object plane and the third reflecting surface, Lt2 be a distance between the third reflecting surface and the image plane, Pt1 be a distance between the first reflecting surface and the third reflecting surface, and Pt2 be a distance between the third reflecting surface and the fifth reflecting surface, with no reflecting surface existing between the object plane and the first reflecting surface, and between the fifth reflecting surface and the image plane, $$0.05 \leq Pt1/Lt1 \leq 0.2 \text{ or } 0.05 \leq Pt2/Lt2 \leq 0.2$$

is satisfied.

25. The system according to claim 24, wherein a concave reflecting surface forming the first reflecting surface and the fifth reflecting surface includes one curvature radius.

26. The system according to claim 24, wherein the first reflecting surface, the third reflecting surface and the fifth reflecting surface are concave reflecting surfaces, and the second reflecting surface and the fourth reflecting surface are convex reflecting surfaces.

27. The system according to claim 26, wherein the third reflecting surface is a reflecting surface different from the first reflecting surface and the fifth reflecting surface.

28. The system according to claim 24, wherein letting R1 be a curvature radius of the first reflecting surface, R3 be a curvature radius of the third reflecting surface, and R5 be a curvature radius of the fifth reflecting surface, $$0.8 \leq R3/R1 \leq 1.25 \text{ or } 0.8 \leq R3/R5 \leq 1.25$$

is satisfied.

29. An exposure apparatus comprising:
an illumination optical system configured to illuminate a mask with light from a light source; and
a projection optical system configured to project an image of a pattern of the mask onto a substrate,
wherein the projection optical system includes each reflecting surface is arranged such that light from an object plane forms an image on an image plane by being reflected by a first reflecting surface, a second reflecting surface, a third reflecting surface, a fourth reflecting surface, and a fifth reflecting surface in an order named, and
wherein letting Lt1 be a distance between the object plane and the third reflecting surface, Lt2 be a distance between the third reflecting surface and the image plane, Pt1 be a distance between the first reflecting surface and the third reflecting surface, and Pt2 be a distance between the third reflecting surface and the fifth reflecting surface, with no reflecting surface existing between the object plane and the first reflecting surface, and between the fifth reflecting surface and the image plane, $$0.05 \leq Pt1/Lt1 \leq 0.2 \text{ or } 0.05 \leq Pt2/Lt2 \leq 0.2$$

is satisfied.

30. A method of manufacturing an article, the method comprising:
forming a pattern on a substrate using an exposure apparatus; and
developing the exposed substrate to manufacture the article,
wherein the exposure apparatus comprises:
an illumination optical system configured to illuminate a mask with light from a light source; and
a projection optical system configured to project an image of a pattern of the mask onto the substrate,
wherein the projection optical system includes each reflecting surface is arranged such that light from an object plane forms an image on an image plane by being reflected by a first reflecting surface, a second reflecting surface, a third reflecting surface, a fourth reflecting surface, and a fifth reflecting surface in an order named, and wherein letting Lt1 be a distance between the object plane and the third reflecting surface, Lt2 be a distance between the third reflecting surface and the image plane, Pt1 be a distance between the first reflecting surface and the third reflecting surface, and Pt2 be a distance between the third reflecting surface and the fifth reflecting surface, with no reflecting surface existing between the object plane and the first reflecting surface, and between the fifth reflecting surface and the image plane, $$0.05 \leq Pt1/Lt1 \leq 0.2 \text{ or } 0.05 \leq Pt2/Lt2 \leq 0.2$$

is satisfied.

31. The system according to claim 1, wherein the first concave reflecting surface and the third concave reflecting surface are formed by one concave mirror and the second concave reflecting surface reflects light passed through an opening provided in a center of the concave mirror.

32. The system according to claim 18, wherein the first reflecting surface and the fifth reflecting surface are formed by one concave mirror and the third reflecting surface reflects light passed through an opening provided in a center of the concave mirror.

33. The system according to claim 24, wherein $$0.05 \leq Pt1/Lt1 \leq 0.2 \text{ or } 0.05 \leq Pt2/Lt2 \leq 0.2$$

are satisfied.

* * * * *